United States Patent
Li

(10) Patent No.: US 11,502,718 B1
(45) Date of Patent: Nov. 15, 2022

(54) DIGITAL ISOLATOR MODULE WITH PULSE CARRIER MODULATION

(71) Applicant: AMAZING MICROELECTRONIC CORP., New Taipei (TW)

(72) Inventor: Guan-Shun Li, Pingtung County (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 17/389,738

(22) Filed: Jul. 30, 2021

(51) Int. Cl.
*H04B 1/40* (2015.01)
*H03K 19/20* (2006.01)

(52) U.S. Cl.
CPC .............. *H04B 1/40* (2013.01); *H03K 19/20* (2013.01)

(58) Field of Classification Search
CPC .................................. H04B 1/40; H03K 19/20
See application file for complete search history.

(56) References Cited

U.S. PATENT DOCUMENTS

| | | | |
|---|---|---|---|
| 7,514,844 B2 | 4/2009 | Unkrich | |
| 7,586,392 B2 | 9/2009 | Unkrich | |
| 10,511,467 B2 | 12/2019 | Litmanen et al. | |
| 2007/0170815 A1 | 7/2007 | Unkrich | |
| 2007/0171002 A1 | 7/2007 | Unkrich | |
| 2015/0381219 A1* | 12/2015 | Kramer | H03F 1/02 375/297 |
| 2018/0108621 A1* | 4/2018 | Burton | H01L 24/49 |

\* cited by examiner

*Primary Examiner* — Kenneth T Lam
(74) *Attorney, Agent, or Firm* — Rosenberg, Klein & Lee

(57) ABSTRACT

A digital isolator module with pulse carrier modulation is provided, comprising an isolation barrier, operable to develop an isolated output signal in response to an input signal, a transmitter circuit adapted to receive a data input signal and coupled to the isolation barrier, and a receiver circuit coupled to the isolation barrier to receive the isolated output signal and generate a data output signal. The transmitter circuit is adapted to be operable to generate a transmitter output signal in response to the data input signal, and the transmitter output signal comprises different number of pulse carrier respectively responsive to a rising edge and a falling edge of the data input signal. By employing the proposed pulse carrier modulation of the present invention, it has been verified to reduce channel numbers, IC power consumption and electromagnetic interferences. In addition, jitter disturbances can be avoided and solved effectively.

13 Claims, 21 Drawing Sheets

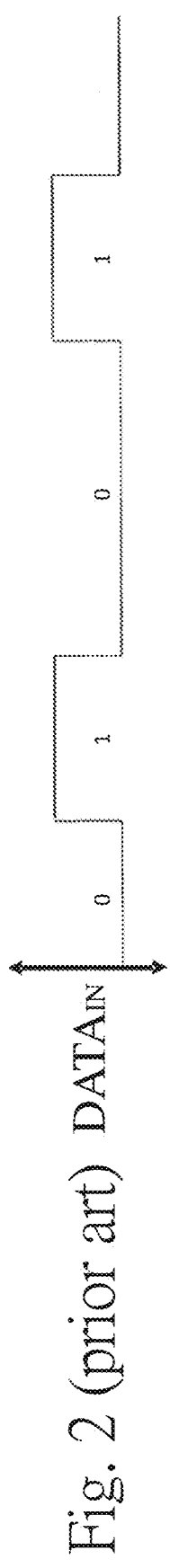
Fig. 2 (prior art) DATA$_{IN}$
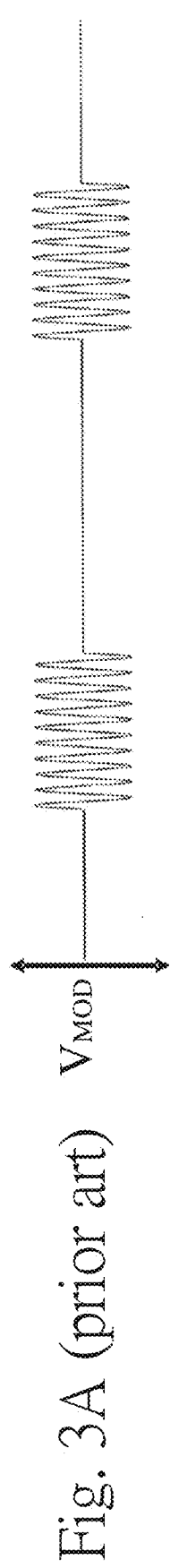
Fig. 3A (prior art) V$_{MOD}$
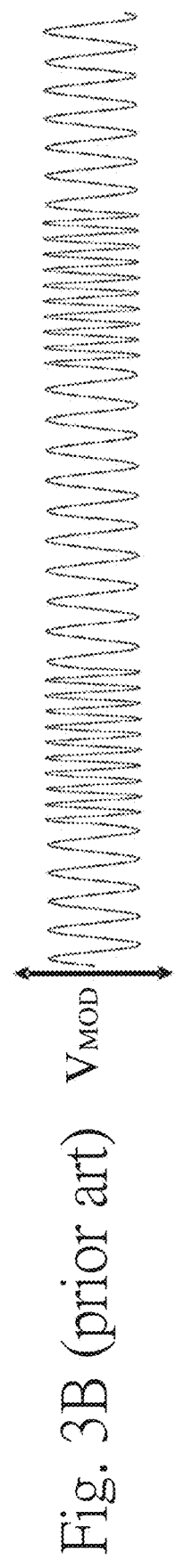
Fig. 3B (prior art) V$_{MOD}$
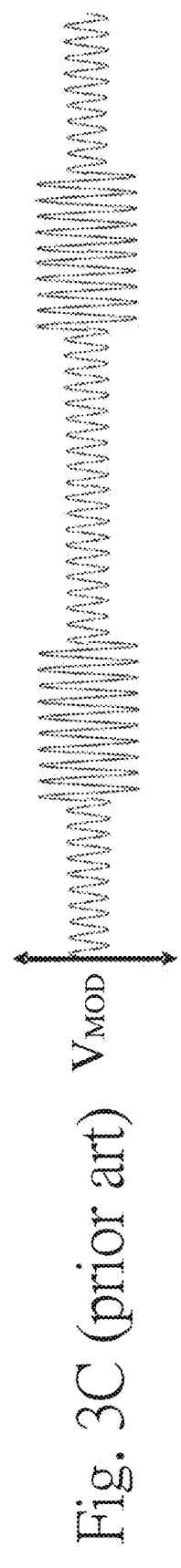
Fig. 3C (prior art) V$_{MOD}$

US 11,502,718 B1

DIGITAL ISOLATOR MODULE WITH PULSE CARRIER MODULATION

BACKGROUND OF THE INVENTION

Field of the Invention

The present invention is related to a digital isolator diagram, and more particularly to a digital isolator module with pulse carrier modulation, so as to reduce channel numbers for signal coupling as well as power consumption and electromagnetic interferences.

Description of the Prior Art

As we know, many electronic systems have certain needs to isolate electrical signals in one portion of the system from electrical signals in another portion of the system. In many control systems, for example, both high voltage and low voltage signals may be generated and monitored, and isolation between these signals is required for proper operation of the system. Therefore, isolation circuits are known as the interface circuits that provide galvanic isolation between two communicating blocks, for example, a transmitter circuit (TX) and a receiver circuit (RX). Such isolation circuits are required to eliminate avoidable ground loops, and also to protect high voltage sensitive circuits. These circuits ensure electric insulation and signal isolation between the circuits, ensuring reliable data transmission between the two circuits, isolating the signal from fast transient common mode noise.

In general, a variety of different devices and techniques have been utilized to communicate signals from one portion of a system to another portion of the system while maintaining isolation between the portions. Devices that provide this communication and isolation are generally referred to as digital isolators. In operation, a digital isolator receives an input electrical signal from a first portion of a system and converts this signal into a corresponding signal that is then communicated across an isolation barrier. The signal communicated across the isolation barrier is received and converted into an isolated output electrical signal that is then applied to a second portion of the system, with the received electrical signal corresponding to the input electrical signal from the first portion of the system.

Please refer to FIG. 1, which shows a functional block diagram of a conventional digital isolator architecture, wherein a digital isolator 100 includes an acoustic isolation transformer 102. In operation, a digital data input signal $DATA_{IN}$ is applied through an input buffer 104 to generate an input control signal $V_{CNTRL}$, which is applied to a transmitter 106. In response to the input control signal $V_{CNTRL}$ from the input buffer 104, the transmitter 106 generates a modulated signal $V_{MOD}$. And in response to the modulated signal $V_{MOD}$, the acoustic isolation transformer 102 generates a transformer output signal $V_{TRAN}$ that is utilized in generating a data output signal $DATA_{OUT}$ from the digital isolator 10, wherein a receiver 108 that receives the transformer output signal $V_{TRAN}$ from the acoustic isolation transformer 102 and demodulates the signal to generate a demodulated signal $V_{DEM}$. The type of demodulation performed by the receiver 108 depends, of course, upon the type of modulation utilized by the transmitter 106. An output buffer 110 receives the demodulated signal $V_{DEM}$ from the receiver 108 and generates the data output signal $DATA_{OUT}$ in response to the demodulated signal $V_{DEM}$, with the data output signal $DATA_{OUT}$ corresponding to the originally applied digital data input signal $DATA_{IN}$. The mechanism in which the transmitter 106 converts or modulates the digital data input signal $DATA_{IN}$ to generate the modulated signal $V_{MOD}$ that is applied to the acoustic isolation transformer 102 improves the overall operation, performance, channel density, and cost of the digital isolator 100. Please refer to FIG. 2 for the signal diagram of the digital data input signal $DATA_{IN}$ of FIG. 1. FIG. 3A, FIG. 3B and FIG. 3C are the signal diagrams illustrating the modulated signal $V_{MOD}$ developed by the transmitter 106 of FIG. 1 by employing various modulation techniques implemented by the transmitter 106 of FIG. 1. FIG. 3A illustrates the modulated signal $V_{MOD}$ generated by the transmitter 106 wherein the transmitter 106 implements On/Off Keying (OOK) modulation of the applied input control signal $V_{CNTRL}$. FIG. 3B illustrates the modulated signal $V_{MOD}$ generated by the transmitter 106 wherein the transmitter 106 implements Frequency Shift Keying (FSK) modulation of the applied input control signal $V_cNR$, in which when the digital data input signal $DATA_{IN}$ is low, the modulated signal $V_{MOD}$ is a sinusoidal signal having a first frequency and when the digital data input signal $DATA_{IN}$ turns high, the modulated signal $V_{MOD}$ transitions to a sinusoidal signal having a second frequency, with the second frequency being different (higher) than the first frequency.

FIG. 3C illustrates the modulated signal $V_{MOD}$ generated by the transmitter 106 wherein the transmitter 106 implements Amplitude Shift Keying (ASK) modulation of the applied input control signal $V_{CNTRL}$ in which when the digital data input signal $DATA_{IN}$ is low, the modulated signal $V_{MOD}$ is a sinusoidal signal having a first amplitude and when the digital data input signal $DATA_{IN}$ turns high, the modulated signal $V_{MOD}$ transitions to a sinusoidal signal having a second amplitude, with the second amplitude being different (greater) than the first amplitude. In these examples of signal modulations, the modulated signal $V_{MOD}$ may be a continuous periodic signal, burst periodic signal, or burst non periodic signal.

However, as illustrated in FIG. 3A-3C as referring to FIG. 2 at the same time, it is worth noticing that in a conventional design module of a conventional digital isolator architecture, when the digital data input signal $DATA_{IN}$ is high (digital level is "1"), the transmitter 106 outputs continuous and indefinite pulse carriers of the modulated signal $V_{MOD}$ as shown in FIG. 3A-3C. And, such indefinite pulse carriers result in causing tremendous power consumption and severe electromagnetic interference (EMI) issues. Moreover, the transmitter 106 even outputs these continuous and indefinite pulse carriers of the modulated signal $V_{MOD}$ when the digital data input signal $DATA_{IN}$ is low (digital level is "0"), as illustrated in FIG. 3B and FIG. 3C when the FSK and ASK modulation techniques are utilized. As a result, it is believed that the power consumption and electromagnetic interference issues will be even worse. A modified architecture as shown in FIG. 4, is then proposed, trying to solve the previously mentioned problems, in which a two-communication channels diagram is employed, which necessarily requires two pairs of transmitters 106A, 106B, acoustic isolation transformer 102A, 102B and receivers 108A, 108B. As such, FIG. 5 illustrates the modulated signals $V_{MODA}$ and $V_{MODB}$ which are respectively generated by the transmitters 106A and 106B, as referring to the signal diagram of the digital data input signal $DATA_A$, wherein the transmitters 106A and 106B implement burst OOK modulation of the applied input control signal $V_{CNTRL}$ and $V_{CNTRL*}$, respectively. However, in such a two-communication channels design diagram, channel numbers are increased, and circuit production cost and area consumption are also problems to be faced and solved. As a result, it is believed that all the foregoing conventional design are still in lack of extensive utility and can not be widely used.

Under such circumstances, it, in view of all, should be apparent and obvious that there is indeed an urgent need for the professionals in the field for a novel and inventive digital isolator architecture to be developed, so as to solve the above mentioned issues, and to reduce communication channel numbers, power consumption and electromagnetic interferences at the same time.

SUMMARY OF THE INVENTION

In order to overcome the above mentioned disadvantages, one major objective in accordance with the present invention is provided for a novel and creative digital isolator module which is characterized by utilizing a proposed pulse carrier modulation technique. By employing the proposed pulse carrier modulation technique to a transmitter circuit, the transmitter circuit is operable to generate a transmitter output signal, which comprises different number of pulse carrier responsive to a rising edge and a falling edge of a data input signal, respectively. And therefore, the digital isolator module with pulse carrier modulation is able to transmit data signals and main accurate data transmission result in a single one communication channel architecture structure. The system complexity of such a digital isolator module with pulse carrier modulation, compared to the prior arts is thus, greatly much reduced.

Another objective in accordance with the present invention is provided for a novel digital isolator module with pulse carrier modulation. As for the transmitter circuit operable to generate a transmitter output signal, including different number of pulse carrier respectively responsive to a rising edge and a falling edge of a data input signal, a number of a first plurality of pulse carrier of the first division signal of the transmitter output signal and that of a second plurality of pulse carrier of the second division signal of the transmitter output signal are different. Unlike the conventional transmitter output signal which generates continuous and indefinite pulse carriers when the data input signal is kept at a high or even low voltage level, the modified transmitter output signal of the present invention is modulated and includes less number of pulse carriers, and therefore, the prior power consumption and severe electromagnetic interference issues are believed to be eliminated in the present invention.

In addition, and yet another objective in accordance with the present invention is provided for a digital isolator module with pulse carrier modulation. Through the experiment data and simulation results that will be discussed and provided in the following descriptions, it will be verified that jitter disturbances of the data output signals from the transmitter circuit are effectively prevented at the same time. Thereby, it is worthy of full attentions that the present invention achieves to successfully solves the problems of prior arts and meanwhile maintain precise data transmission result as well as superior system robustness. As a result, the proposed digital isolator module with pulse carrier modulation is apparent as being highly competitive and able to be widely utilized in any related industries.

For achieving the above mentioned objectives, the present invention is aimed to provide a digital isolator module with pulse carrier modulation, comprising an isolation barrier, operable to develop an isolated output signal in response to an input signal, a transmitter circuit adapted to receive a data input signal and coupled to the isolation barrier, and a receiver circuit coupled to the isolation barrier to receive the isolated output signal and operable to generate a data output signal in response to the isolated output signal.

The proposed transmitter circuit is operable to generate a transmitter output signal (TXO) for the input signal in response to the data input signal, wherein the transmitter output signal (TXO) comprises a first division signal and a second division signal. The transmitter circuit starts to generate the first division signal responsive to a first transition of the data input signal from a first logic state to a second logic state and terminate generating the first division signal when the data input signal is still in the second logic state. And then, the transmitter circuit starts to generate the second division signal responsive to a second transition of the data input signal from the second logic state to the first logic state and terminate generating the second division signal when the data input signal is still in the first logic state. According to the embodiment of the present invention, the first division signal comprises a first plurality of pulse carrier, the second division signal comprises a second plurality of pulse carrier, and a number of the first plurality of pulse carrier of the first division signal and that of the second plurality of pulse carrier of the second division signal are different.

According to the embodiment of the present invention, the transmitter output signal (TXO) is periodic since a voltage level of the data input signal should be followed by the voltage level of the transmitter output signal (TXO) and the data input signal is periodic.

A frequency of the first plurality of pulse carrier of the first division signal and that of the second plurality of pulse carrier of the second division signal can be variable. Similarly, an amplitude of the first plurality of pulse carrier of the first division signal and that of the second plurality of pulse carrier of the second division signal can be variable. In addition, according to a preferred embodiment of the present invention, a voltage level of the transmitter output signal after the transmitter circuit terminates generating the first division signal or the second division signal can be variable. In general, those skilled in the art and having general knowledge are able to make appropriate modifications or variations with respective to the technical contents disclosed in the present invention without departing from the spirits of the present invention. However, the modifications or variations should still fall into the scope of the present invention. The present invention is certainly not restricted by the certain limited frequency, amplitude, or voltage level of the first division signal and the second division signal of the transmitter output signal disclosed in the embodiments of the present invention.

In a preferred embodiment of the present invention, the transmitter circuit comprises a rising and falling converter, an oscillator adapted to generate an oscillation signal, and an AND gate. The rising and falling converter is adapted to receive the data input signal and accordingly output a converted data input signal in response to a rising edge and a falling edge of the data input signal. The converted data input signal comprises a first partition signal and a second partition signal, and the rising and falling converter starts to generate the first partition signal responsive to the rising edge of the data input signal and terminate generating the first partition signal before the falling edge of the data input signal. And, the rising and falling converter starts to generate the second partition signal responsive to the falling edge of the data input signal and terminate generating the second partition signal before a next rising edge of the data input signal. And, a first working time of the first partition signal and a second working time of the second partition signal are different.

The AND gate is electrically connected with the rising and falling converter and the oscillator for receiving the converted data input signal and the oscillation signal, and outputting the transmitter output signal.

According to the embodiment of the present invention, the first transition of the data input signal from the first logic state to the second logic state is in response to the rising edge of the data input signal. The second transition of the data input signal from the second logic state to the first logic state is in response to the falling edge of the data input signal.

According to the embodiment of the present invention, the first division signal of the transmitter output signal has a first operational time, and the first operational time is a first time segment between the transmitter circuit starts to generate the first plurality of pulse carrier and to terminate generating the first plurality of pulse carrier. The second division signal of the transmitter output signal has a second operational time, and the second operational time is a second time segment between the transmitter circuit starts to generate the second plurality of pulse carrier and to terminate generating the second plurality of pulse carrier. The first operational time of the first division signal and the second operational time of the second division signal are different.

In addition, the first operational time of the first division signal of the transmitter output signal (TXO) is equal to the first working time of the first partition signal of the converted data input signal, and the second operational time of the second division signal of the transmitter output signal (TXO) is equal to the second working time of the second partition signal of the converted data input signal.

In another aspect, regarding the rising and falling converter configuration, according to a preferred embodiment of the present invention, the rising and falling converter comprises an inverter, a first transmission gate, a second transmission gate, a third transmission gate, a fourth transmission gate and an NOR gate, wherein the inverter receives the data input signal and outputs an inverted data input signal, a first input end of the NOR gate is electrically connected with the first transmission gate and the second transmission gate, and a second input end of the NOR gate is electrically connected with the third transmission gate and the fourth transmission gate. The first transmission gate and the third transmission gate are further connected with an input and an output of the inverter, respectively.

The data input signal is delayed by a first period and a second period to respectively control the first transmission gate and the fourth transmission gate, and the inverted data input signal is delayed by the first period and the second period to respectively control the second transmission gate and the third transmission gate, such that the NOR gate outputs the converted data input signal.

In one embodiment, when the first period is longer than the second period, the first working time of the first partition signal of the converted data input signal is longer than the second working time of the second partition signal of the converted data input signal.

Alternatively, in another embodiment, when the second period is longer than the first period, the second working time of the second partition signal of the converted data input signal is longer than the first working time of the first partition signal of the converted data input signal.

As a result, based on the above, it has been proved and verifier that the present invention is sophisticatedly designed and indeed discloses a novel pulse carrier modulation technique for a digital isolator module. The whole new pulse carrier modulation technique can be employed in a transmitting circuit (TX) architecture and has been verified to succeed in minimizing system power consumption and electromagnetic interferences. Meanwhile, jitter disturbances are obviously and effectively avoided. As a result, the proposed digital isolator module with pulse carrier modulation disclosed by the present invention, is beneficial to maintain and achieve superior system robustness and precise data transmission results. Thus, it is believed that the present invention is advantageous of having excellent control stability over system levels as well as maintaining precise control ability to the isolation circuits while compared to the prior arts.

These and other objectives of the present invention will become obvious to those of ordinary skill in the art after reading the following detailed description of preferred embodiments.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 2 shows the signal diagram of the digital data input signal $DATA_{IN}$ of FIG. 1.

FIG. 3A shows the signal diagram of the modulated signal $V_{MOD}$ developed by the transmitter of FIG. 1 by employing On/Off Keying (OOK) modulation technique implemented by the transmitter of FIG. 1.

FIG. 3B shows the signal diagram of the modulated signal $V_{MOD}$ developed by the transmitter of FIG. 1 by employing Frequency Shift Keying (FSK) modulation technique implemented by the transmitter of FIG. 1.

FIG. 3C shows the signal diagram of the modulated signal $V_{MOD}$ developed by the transmitter of FIG. 1 by employing Amplitude Shift Keying (ASK) modulation technique implemented by the transmitter of FIG. 1.

DESCRIPTION OF THE PREFERRED EMBODIMENTS

Figure 1:
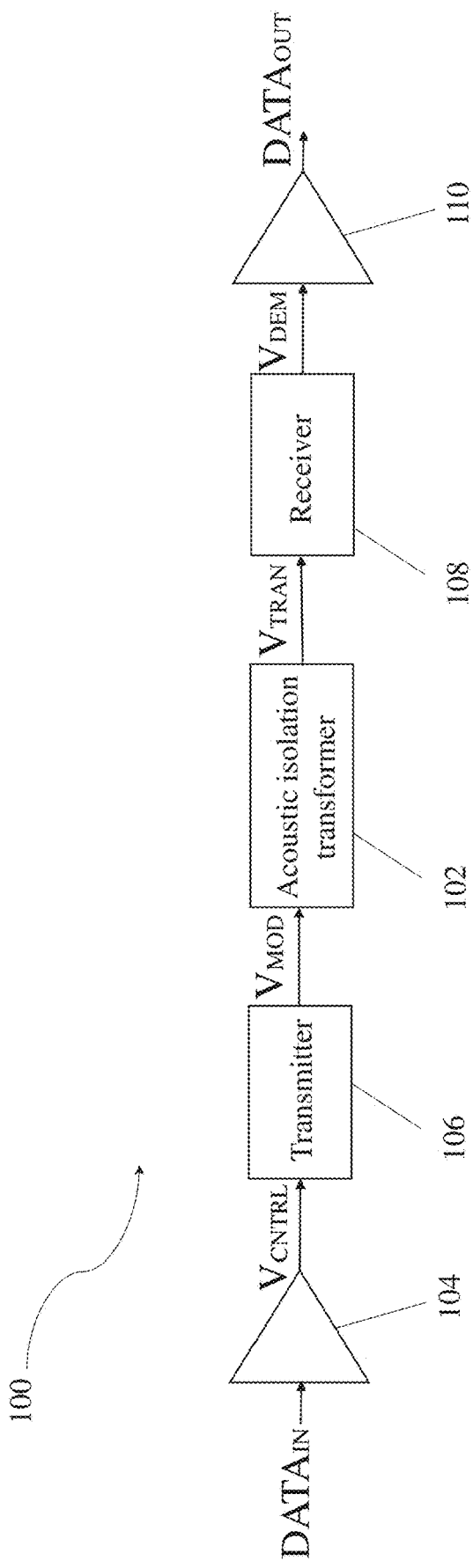
FIG. 1 shows a functional block diagram of a conventional digital isolator architecture.
Figure 4:
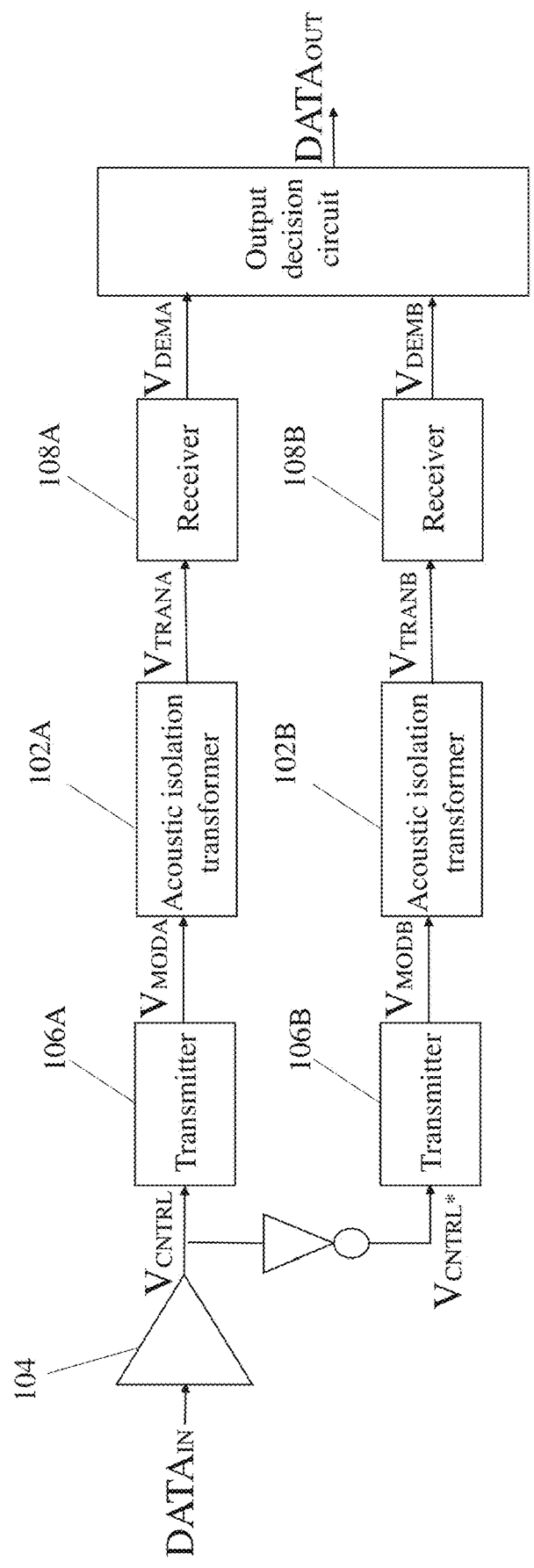
FIG. 4 shows a functional block diagram of a conventional digital isolator architecture using a two-communication channels diagram.
Figure 5:
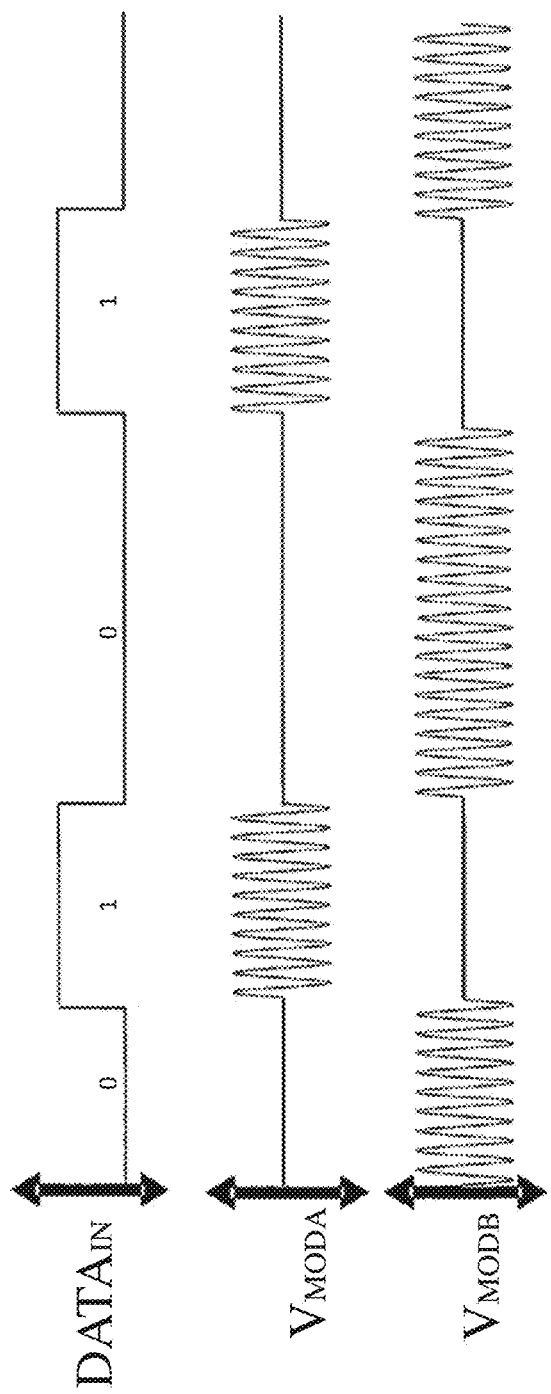
FIG. 5 shows the signal diagrams of the digital data input signal $DATA_{IN}$ and the modulated signals $V_{MODA}$ and $V_{MODB}$ developed by the transmitters of FIG. 4 by employing burst OOK modulation technique implemented by the transmitters of FIG. 4.

Reference will now be made in detail to the preferred embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

Figure 6:
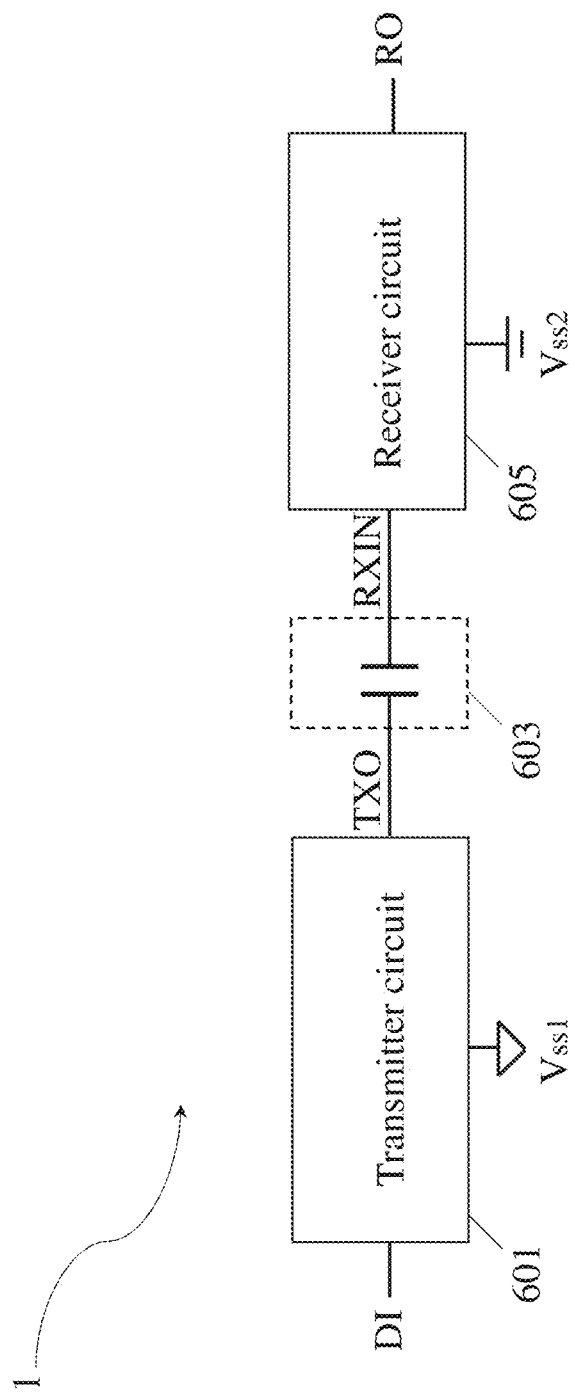
FIG. 6 shows a block diagram of a digital isolator module with pulse carrier modulation in accordance with one embodiment of the present invention.

In the following descriptions, please refer to FIG. 6 first, in which FIG. 6 shows a block diagram of a digital isolator module with pulse carrier modulation in accordance with one embodiment of the present invention. The digital isolator module 1 with pulse carrier modulation includes a transmitter circuit 601, an isolation barrier 603 and a receiver circuit 605. The transmitter circuit 601 is electrically connected to a first ground voltage level $V_{ss1}$ and the receiver circuit 605 is electrically connected to a second ground voltage level $V_{ss2}$. The isolation barrier 603 is electrically connected between the transmitter circuit 601 and the receiver circuit 605.

The proposed transmitter circuit 601 of the present invention is adapted to receive a data input signal DI and coupled to the isolation barrier 603, and the transmitter circuit 601 is operable to generate a transmitter output signal TXO in response to the data input signal DI. The transmitter output signal TXO is an input signal of the isolation barrier 603. The isolation barrier 603 is operable to develop an isolated output signal in response to the input signal, which is the transmitter output signal TXO. And therefore, the receiver circuit 605 is coupled to the isolation barrier 603 to receive the isolated output signal as a receiver input signal RXIN and the receiver circuit 605 is operable to generate a data output signal RO in response to the isolated output signal (the receiver input signal RXIN). In one embodiment of the present invention, the isolation barrier 603, for example can be composed of at least one isolation capacitance or the like.

According to a preferred embodiment of the present invention, the proposed transmitter circuit 601 of the present invention is aimed to be operable to generate the transmitter output signal TXO in response to the data input signal DI. Please refer to FIG. 7 for the illustrated waveforms of the data input signal DI, the transmitter output signal TXO, the receiver input signal RXIN and the data output signal RO in accordance with the embodiment architecture in FIG. 6.

Figure 7:
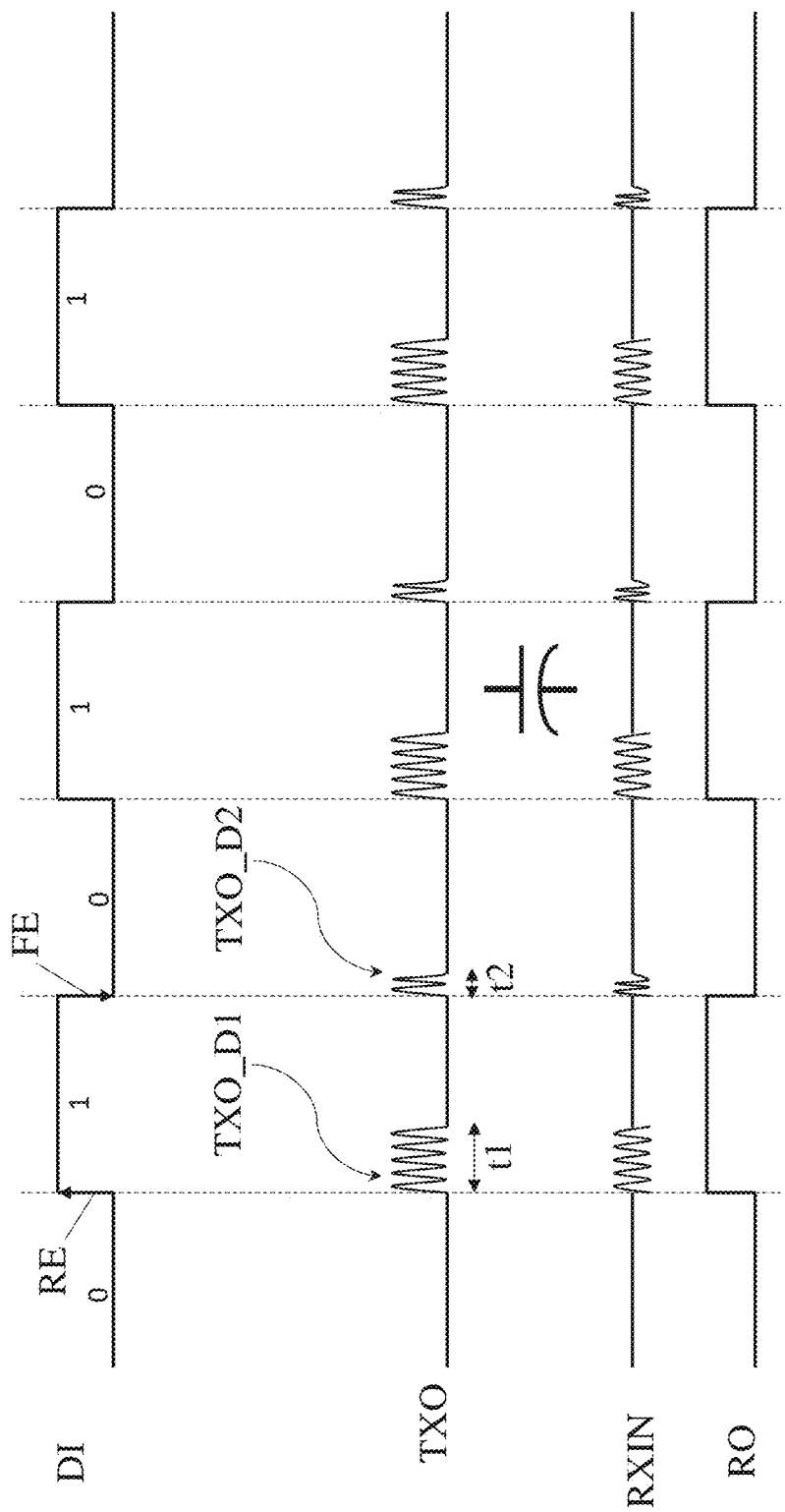
FIG. 7 shows a plurality of illustrated waveforms of the data input signal DI, the transmitter output signal TXO, the receiver input signal RXIN and the data output signal RO in accordance with the embodiment architecture in FIG. 6.

As shown in FIG. 7, it can be observed that the transmitter output signal TXO comprises a first division signal TXO_D1 and a second division signal TXO_D2, and the transmitter output signal TXO is periodic since a voltage level of the data input signal DI should be followed by the voltage level of the transmitter output signal TXO and the data input signal DI is periodic. The transmitter circuit 601 starts to generate the first division signal TXO_D1 responsive to a first transition of the data input signal DI from a first logic state to a second logic state and terminate generating the first division signal TXO_D1 when the data input signal DI is still in the second logic state. In the embodiment of the present invention, the first logic state is indicated by the data input signal DI at a low voltage level, as the digital level "0". And, the second logic state is indicated by the data input signal DI at a high voltage level, as the digital level "1". The first transition of the data input signal DI from the first logic state to the second logic state is referred as when the data input signal DI is turning from the digital level "0" to the digital level "1" and in response to a rising edge RE of the data input signal DI. Similarly, a second transition of the data input signal DI from the second logic state to the first logic state is referred as when the data input signal DI is turning from the digital level "1" to the digital level "0" and in response to a falling edge FE of the data input signal DI.

As can be seen, the transmitter circuit 601 starts to generate the second division signal TXO_D2 responsive to the second transition of the data input signal DI from the second logic state "1" to the first logic state "0" and terminate generating the second division signal TXO_D2 when the data input signal DI is still in the first logic state "0". According to the preferred embodiment of the present invention, the first division signal TXO_D1 comprises a first plurality of pulse carrier, the second division signal TXO_D2 comprises a second plurality of pulse carrier, and a number of the first plurality of pulse carrier of the first division signal TXO_D1 and that of the second plurality of pulse carrier of the second division signal TXO_D2 are different.

According to the pulse carrier modulation technique of the present invention, the first division signal TXO_D1, for instance, can be designed to have more numbers of pulse carrier than the second division signal TXO_D2 as shown in FIG. 7 waveforms. Alternatively, the second division signal TXO_D2 can be selectively designed to have more numbers of pulse carrier than the first division signal TXO_D1 according to various embodiment of the present invention. The present invention is not limited thereto. Overall, it is believed that for people who are skilled in the art and having understandings and technical backgrounds to the present invention, it would be allowed for them to make various modifications or changes depending on different circuit regulations and/or specifications without departing from the scope of the invention. That is to say, the present invention is certainly not limited thereto.

In addition, a frequency of the first plurality of pulse carrier of the first division signal TXO_D1 and that of the second plurality of pulse carrier of the second division signal TXO_D2 can be variable. Similarly, an amplitude of the first plurality of pulse carrier of the first division signal TXO_D1 and that of the second plurality of pulse carrier of the second division signal TXO_D2 can be variable as well.

To be more specific, the first division signal TXO_D1 has a first operational time t1, and the first operational time t1 is a first time segment between the transmitter circuit 601 starts to generate the first plurality of pulse carrier of the first division signal TXO_D1 and to terminate generating the first plurality of pulse carrier of the first division signal TXO_D1. In addition, the second division signal TXO_D2 has a second operational time t2, and the second operational time t2 is a second time segment between the transmitter circuit 601 starts to generate the second plurality of pulse carrier of the second division signal TXO_D2 and to terminate generating the second plurality of pulse carrier of the second division signal TXO_D2. According to the embodiment of the present invention, the first operational time t1 of the first division signal TXO_D1 and the second operational time t2 of the second division signal TXO_D2 are different. By employing the pulse carrier modulation technique as disclosed earlier, the first operational time t1 of the first division signal TXO_D1, for instance, can be longer than the second operational time t2 of the second division signal TXO_D2 as shown in FIG. 7 waveforms. Alternatively, the second operational time t2 of the second division signal TXO_D2 can be selectively designed to be longer than the first operational time t1 of the first division signal TXO_D1 according to various embodiment of the present invention. The present invention is not limited thereto.

As a result, it is evident that the proposed pulse carrier modulation of the present invention achieves to be applicable to the transmitter output signal TXO of a transmitter circuit such that the transmitter output signal TXO of the transmitter circuit includes different number of pulse carriers in response to the rising edge and the falling edge of the data input signal DI, respectively. By such pulse carrier modulation technique, no additional communication channel for signal coupling is required, and thus the conventional issues that channel numbers were increased as disclosed in the prior arts are effectively solved.

Moreover, according to the illustrated waveform of the transmitter output signal TXO as shown in FIG. 7, it can be observed that after the transmitter circuit terminates generating the pulse carriers of the first division signal TXO_D1 or the second division signal TXO_D2, the transmitter output signal TXO enters in a steady-state. In such a steady-state, a voltage level of the transmitter output signal TXO is not necessarily limited to a certain value and can be variable. By employing the design manners for avoiding generating continuous and indefinite pulse carriers during the time period when the data input signal DI is at a high voltage level (digital level="1") or at a low voltage level (digital level="0"), the present invention succeeds in reducing both power consumption and electromagnetic interferences as expected.

Figure 8:
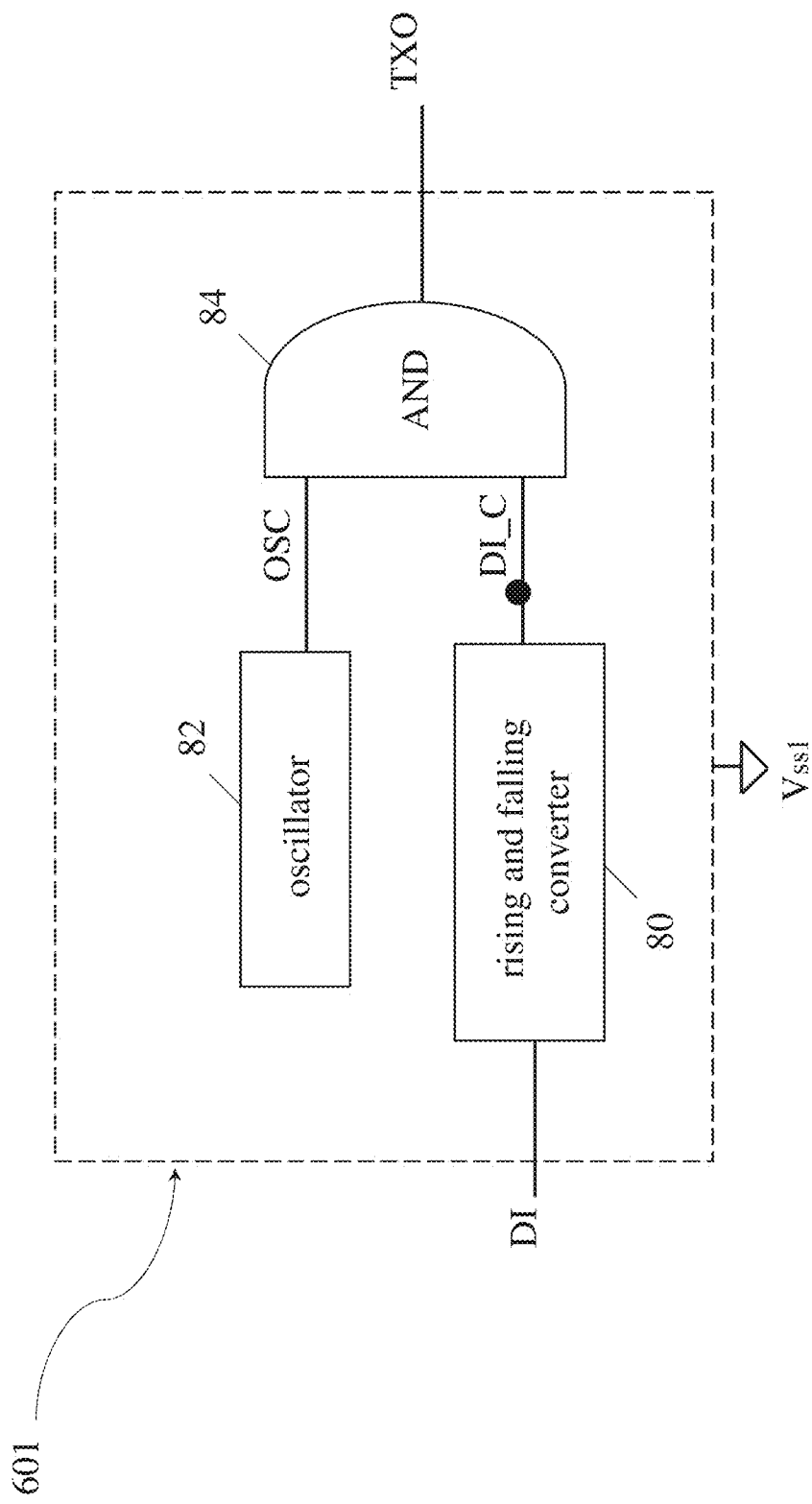
FIG. 8 shows a detailed schematic diagram of the transmitter circuit in accordance with the embodiment of the present invention.

Subsequently, please refer to FIG. 8 for a detailed schematic diagram of the transmitter circuit in accordance with the embodiment of the present invention. As shown in FIG. 8, the proposed transmitter circuit 601 comprises a rising and falling converter 80, an oscillator 82, and an AND gate 84. The rising and falling converter 80 is adapted to receive the data input signal DI and accordingly output a converted data input signal DI_C. The oscillator 82 is adapted to generate an oscillation signal OSC. The AND gate 84 is electrically connected with the rising and falling converter 80 and the oscillator 82 for receiving the converted data input signal DI_C and the oscillation signal OSC, and by employing an AND logic algorithm, outputting the transmitter output signal TXO.

Figure 9:
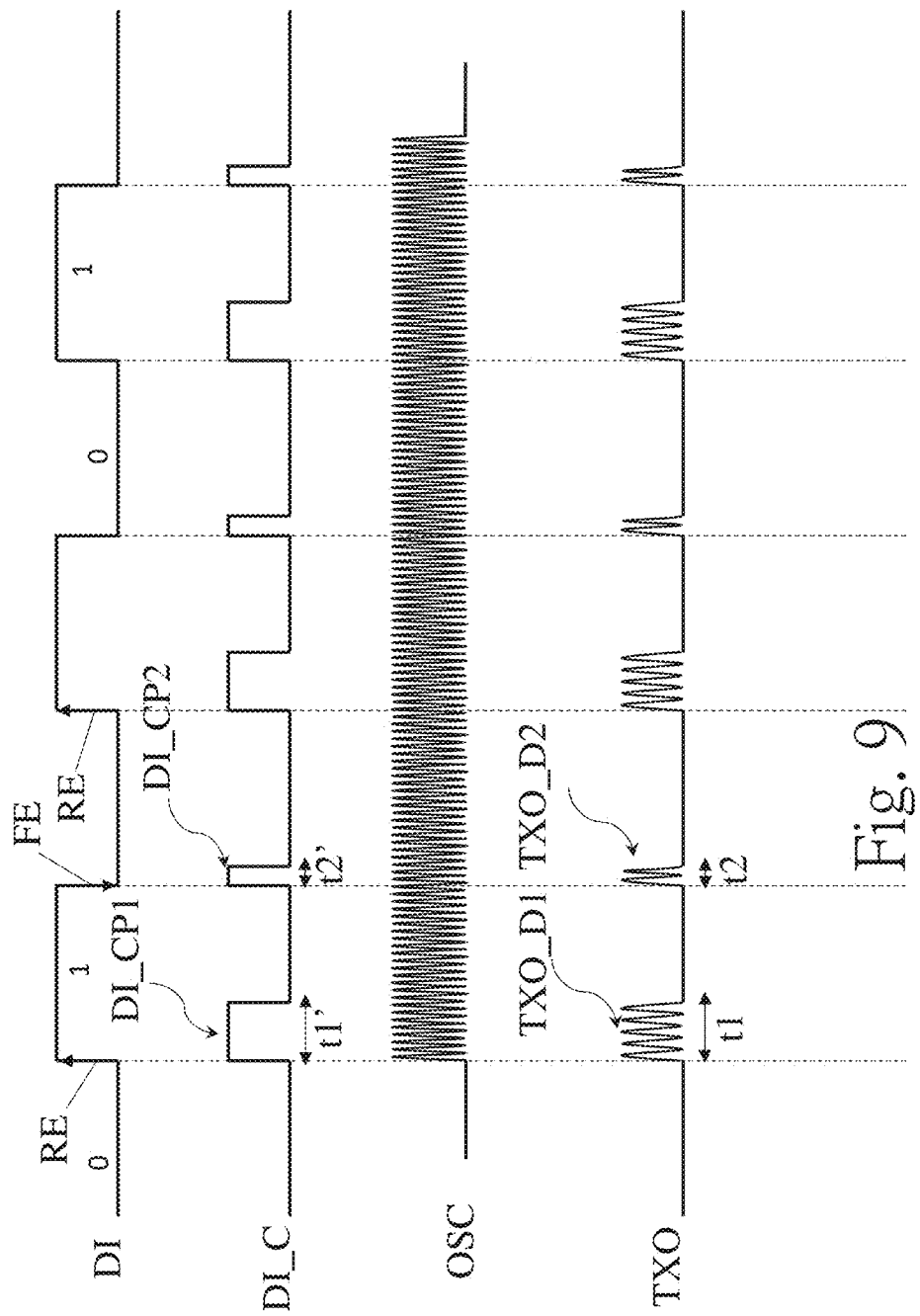
FIG. 9 shows a plurality of illustrated waveforms of the data input signal DI, the converted data input signal DI_C, the oscillation signal OSC and the transmitter output signal TXO in accordance with the transmitter circuit architecture in FIG. 8.

FIG. 9 shows waveforms of the data input signal DI, the converted data input signal DI_C, the oscillation signal OSC and the transmitter output signal TXO in accordance with the transmitter circuit architecture in FIG. 8. As we can see, the rising and falling converter 80 is adapted to receive the data input signal DI and accordingly output the converted data input signal DI_C in response to the rising edge RE and the falling edge FE of the data input signal DI. The converted data input signal DI_C comprises a first partition signal DI_CP1 and a second partition signal DI_CP2, and the converted data input signal DI_C is periodic since a voltage level of the data input signal DI should be followed by the voltage level of the converted data input signal DI_C and the data input signal DI is periodic. According to the embodiment of the present invention, the rising and falling converter 80 starts to generate the first partition signal DI_CP1 responsive to the rising edge RE of the data input signal DI and terminate generating the first partition signal DI_CP1 before the falling edge FE of the data input signal DI. And then, the rising and falling converter 80 starts to generate the second partition signal DI_CP2 responsive to the falling edge FE of the data input signal DI and terminate generating the second partition signal DI_CP2 before a next rising edge RE of the data input signal DI.

According to the preferred embodiment of the present invention, the first partition signal DI_CP1 has a first working time t1', and the first working time t1' is the time segment between the rising and falling converter 80 starts to generate the first partition signal DI_CP1 and to terminate generating the first partition signal DI_CP1. The second partition signal DI_CP2 has a second working time t2', and the second working time t2' is the time segment between the rising and falling converter 80 starts to generate the second partition signal DI_CP2 and to terminate generating second partition signal DI_CP2. In the preferred embodiment of the present invention, the first working time t1' of the first partition signal DI_CP1 of the converted data input signal DI_C and the second working time t2' of the second partition signal DI_CP2 of the converted data input signal DI_C are different.

Subsequently, since the AND gate 84 is electrically connected with the rising and falling converter 80 and the oscillator 82 and receives the converted data input signal DI_C and the oscillation signal OSC as the inputs of the AND gate 84, the transmitter output signal TXO is generated at the output of the AND gate 84, based on the converted data input signal DI_C and the oscillation signal OSC by employing the AND logic algorithm. It is worth noticing that, due to the AND logic algorithm of the AND gate 84, the first operational time t1 of the first division signal TXO_D1 of the transmitter output signal TXO will be determined as equal to the first working time t1' of the first partition signal DI_CP1 of the converted data input signal DI_C, and the second operational time t2 of the second division signal TXO_D2 of the transmitter output signal TXO will be determined as equal to the second working time t2' of the second partition signal DI_CP2 of the converted data input signal DI_C.

Figure 10:
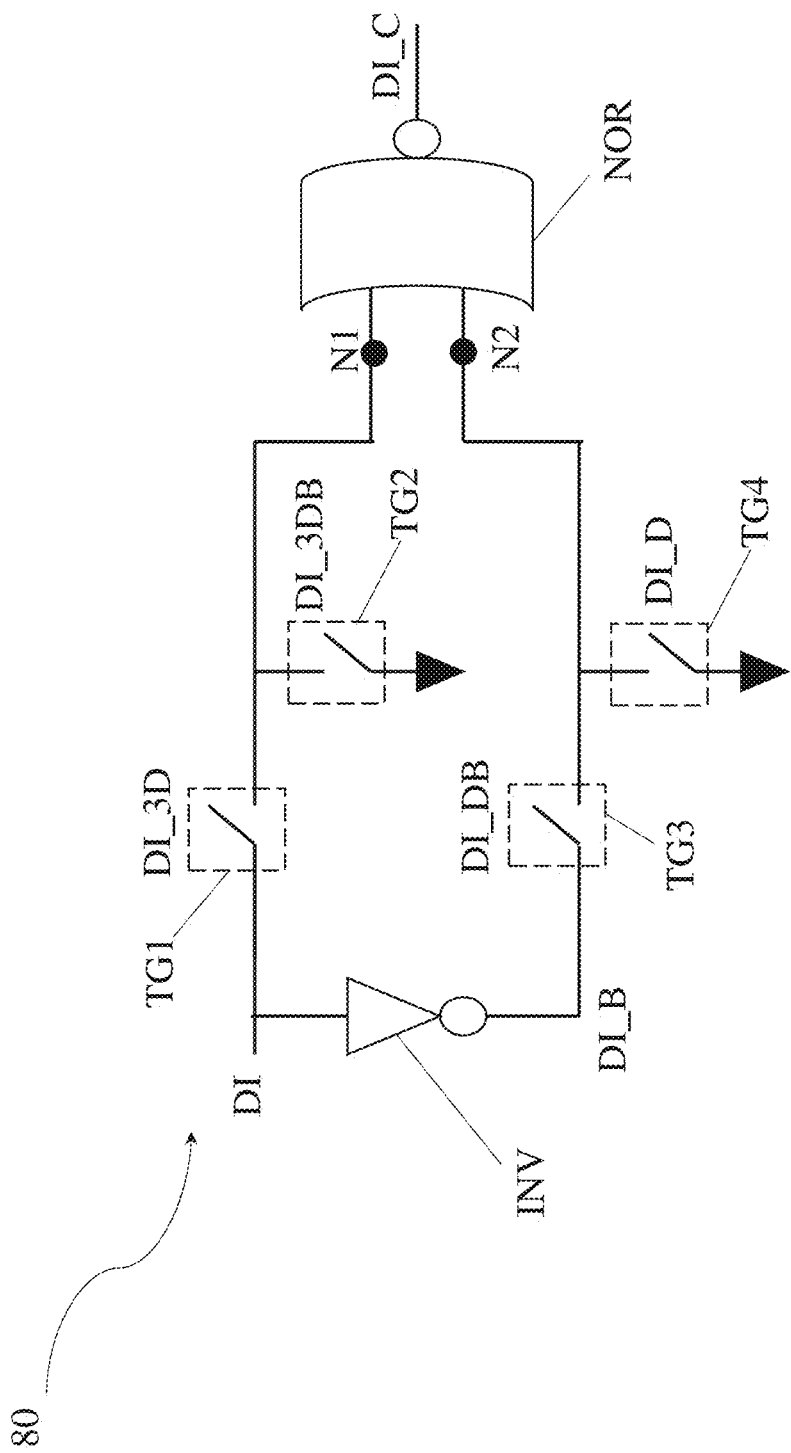
FIG. 10 shows a detailed circuit diagram of a first embodiment of the rising and falling converter in accordance with the present invention.
Figure 11:
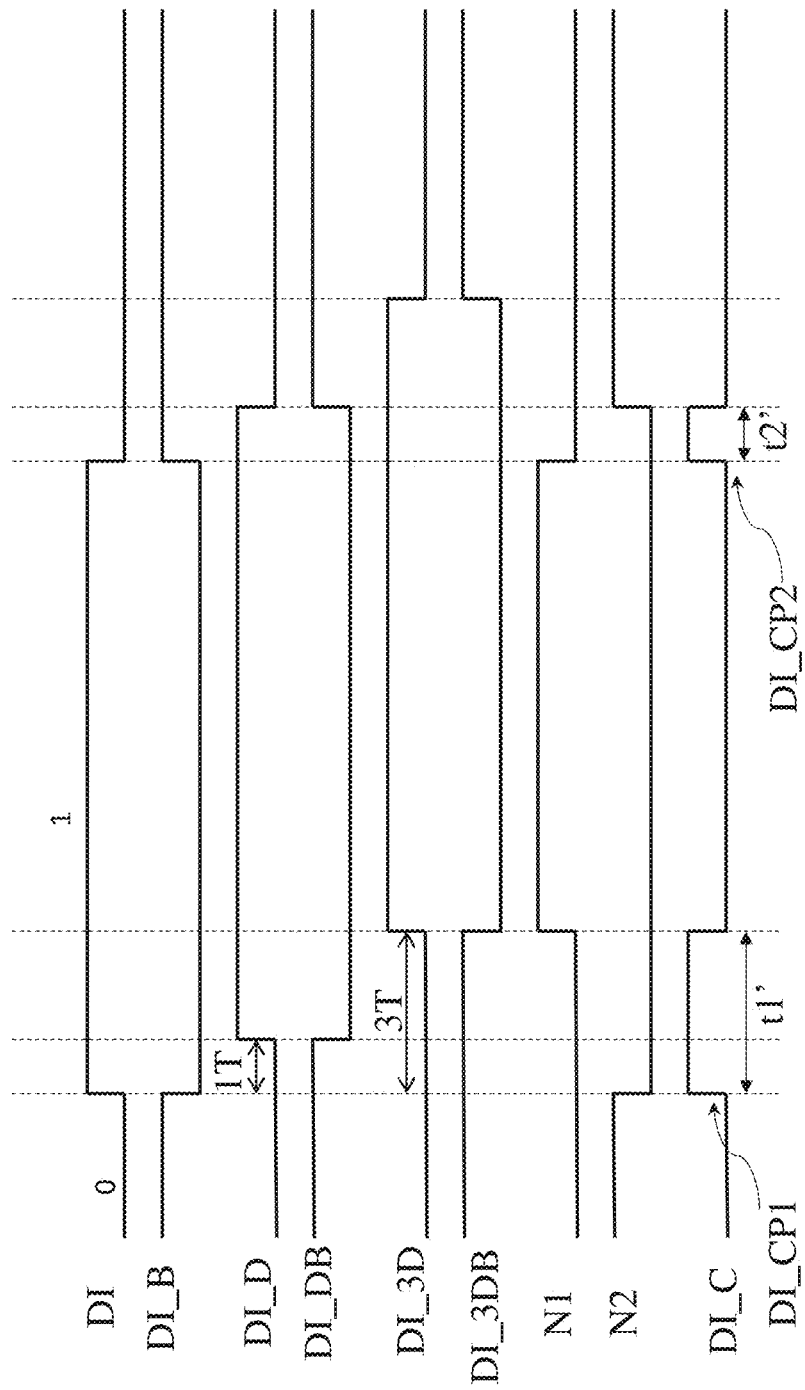
FIG. 11 shows a plurality of illustrated waveforms of the nodes as indicated in FIG. 10.

Moreover, please refer to FIG. 10 for a detailed circuit diagram of a first embodiment of the rising and falling converter in accordance with the present invention. FIG. 11 shows a plurality of the illustrated waveforms of the nodes as indicated in FIG. 10. It is shown that the rising and falling converter 80 includes an inverter INV, a first transmission gate TG1, a second transmission gate TG2, a third transmission gate TG3, a fourth transmission gate TG4 and an NOR gate NOR The inverter INV receives the data input signal DI and outputs an inverted data input signal DI_B. The input (DI) and the output (DI_B) of the inverter INV are respectively connected with the first transmission gate TG1 and the third transmission gate TG3. The data input signal DI is delayed by a first period 3T to form the signal as illustrated as "DI_3D", and the data input signal DI is delayed by a second period 1T to form the signal as illustrated as "DI_D" according to the first embodiment of the rising and falling converter of the present invention. In such a first embodiment, the first period 3T is longer than the second period 1T. And, the delayed signal "DI_3D", which is formed by delaying the data input signal DI by the first period 3T, is generated to control the first transmission gate TG1. And, the delayed signal "DI_D", which is formed by delaying the data input signal DI by the second period 1T, is generated to control the fourth transmission gate TG4.

In a similar methodology, the inverted data input signal DI_B is delayed by the first period 3T and the second period 1T, respectively to form the delayed signal "DI_3DB" and "DI_DB". And, the delayed signal "DI_3DB" and "DI_DB" are respectively generated to control the second transmission gate TG2 and the third transmission gate TG3. A first input end N1 of the NOR gate NOR is electrically connected with the first transmission gate TG1 and the second transmission gate TG2, and a second input end N2 of the NOR gate NOR is electrically connected with the third transmission gate TG3 and the fourth transmission gate TG4. According to the embodiment of the present invention, when the control signal of the foregoing transmission gates TG1, TG2, TG3 and TG4 is at a high voltage level (digital level="1"), the transmission gates TG1, TG2, TG3 and TG4 are connected. Otherwise, if the control signal of the foregoing transmission gates TG1, TG2, TG3 and TG4 is at a low voltage level (digital level="0"), the transmission gates TG1, TG2, TG3 and TG4 are open. As a result, it is observed that the waveforms of the first input end N1 and the second input end N2 are obtained as shown in FIG. 11. And, the NOR gate NOR outputs the converted data input signal DI_C as shown in FIG. 11 waveform according to the waveforms of the first input end N1 and the second input end N2. In such a first embodiment of the rising and falling converter, the first period 3T is longer than the second period 1T, resulting in the first working time t1' of the first partition signal DI_CP1 of the converted data input signal DI_C being longer than the second working time t2' of the second partition signal DI_CP2 of the converted data input signal DI_C.

Figure 12:
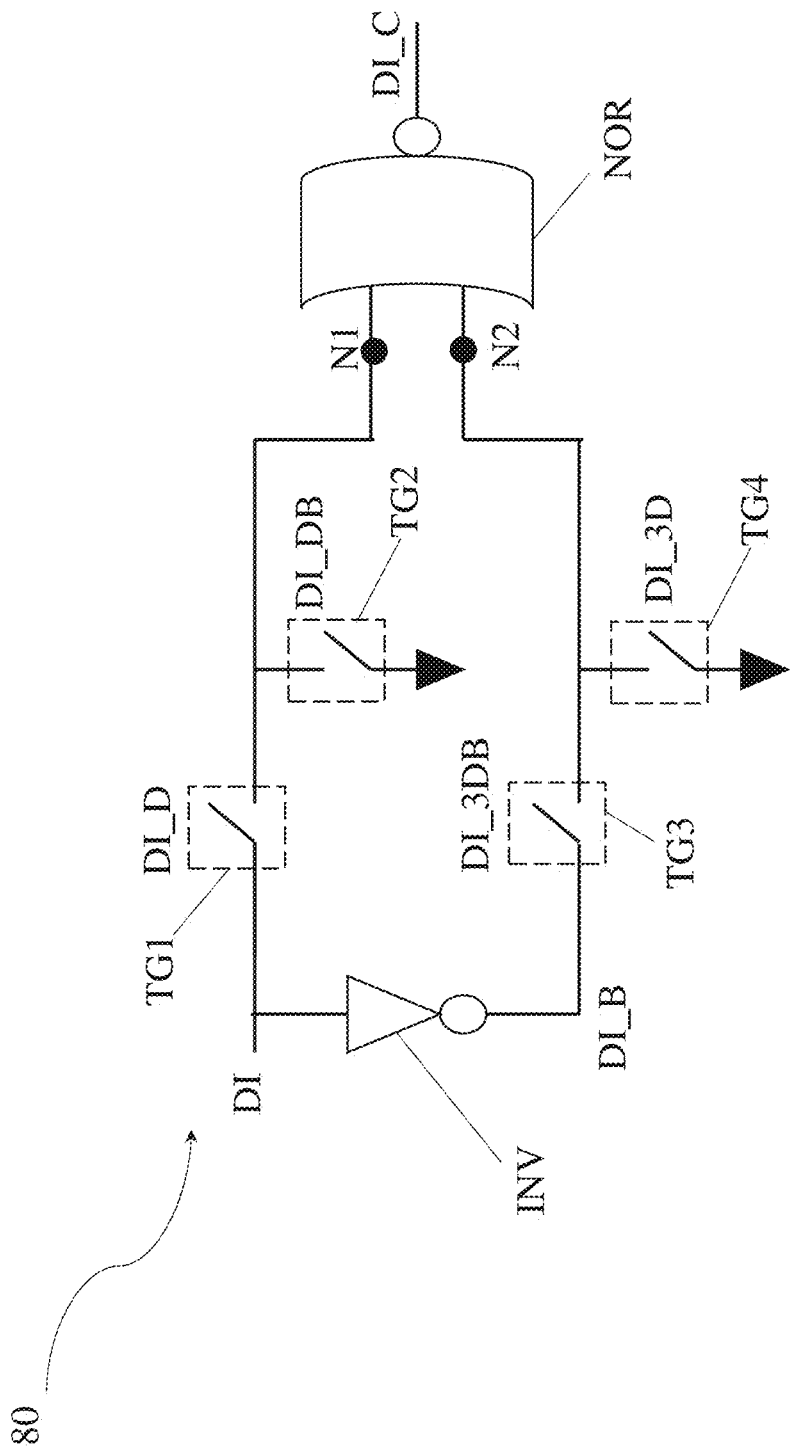
FIG. 12 shows a detailed circuit diagram of a second embodiment of the rising and falling converter in accordance with the present invention.
Figure 13:
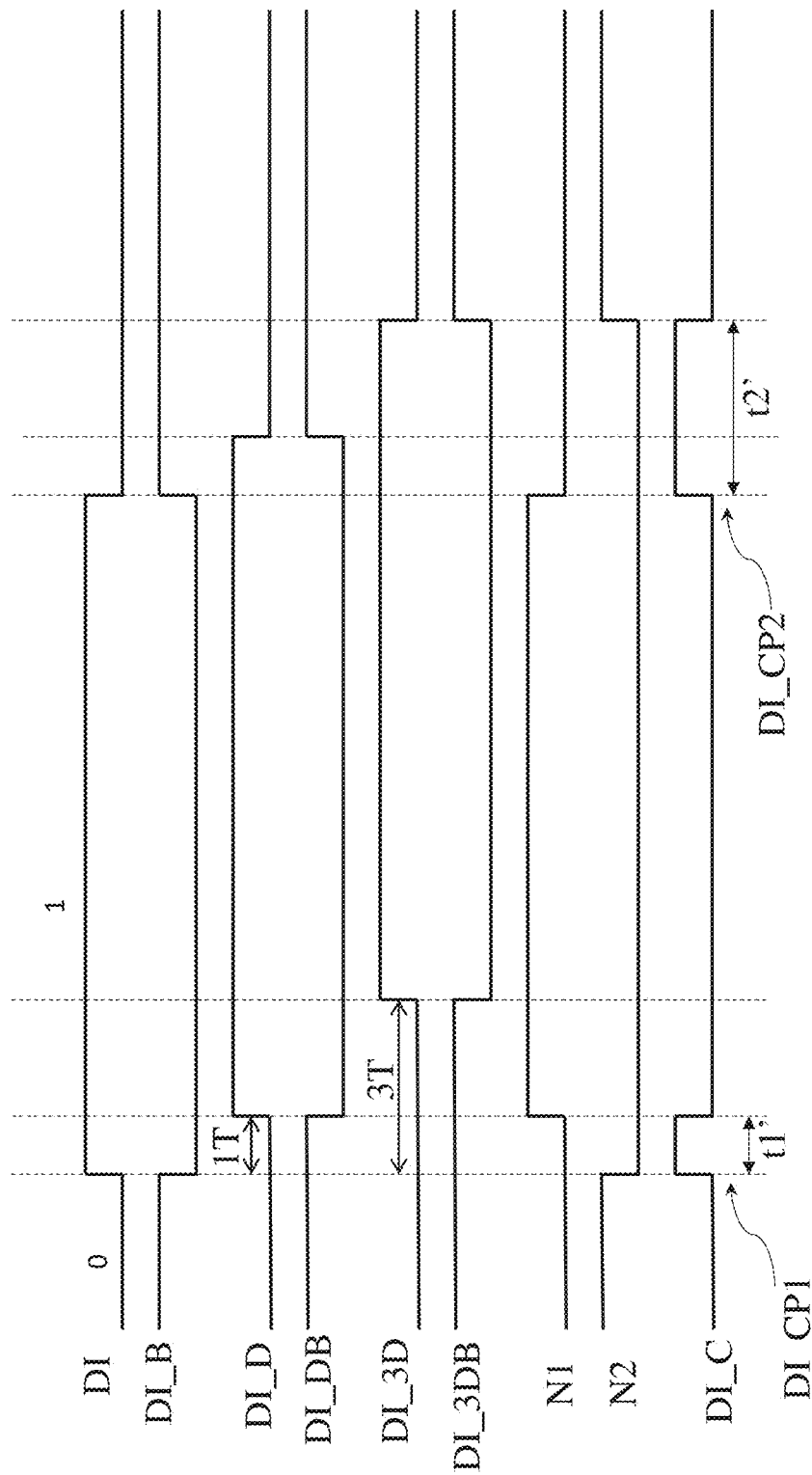
FIG. 13 shows a plurality of illustrated waveforms of the nodes as indicated in FIG. 12.

Furthermore, please refer to FIG. 12, which shows a detailed circuit diagram of a second embodiment of the rising and falling converter in accordance with the present invention. FIG. 13 shows a plurality of the illustrated waveforms of the nodes as indicated in FIG. 12. It is shown that the rising and falling converter 80 includes the inverter INV, the first transmission gate TG1, the second transmission gate TG2, the third transmission gate TG3, the fourth transmission gate TG4 and the NOR gate NOR. The inverter INV receives the data input signal DI and outputs an inverted data input signal DI_B. A first input end N1 of the NOR gate NOR is electrically connected with the first transmission gate TG1 and the second transmission gate TG2, and a second input end N2 of the NOR gate NOR is electrically connected with the third transmission gate TG3 and the fourth transmission gate TG4. The NOR gate NOR outputs the converted data input signal DI_C as shown in FIG. 13 waveform according to the waveforms of the first input end N1 and the second input end N2. As we compare the second embodiment of the rising and falling converter with the previous first embodiment (shown in FIG. 10 and FIG. 11), it can be observed that the first period used in the second embodiment for delaying the data input signal DI and the inverted data input signal DI_B is 1T, and the second period used for delaying the data input signal DI and the inverted data input signal DI_B is 3T. As such, according to the second embodiment, the control signals of the first transmission gate TG1 and the fourth transmission gate TG4 are the delayed signal "DI_D" and "DI_3D", respectively. The control signals of the second transmission gate TG2 and the third transmission gate TG3 are the delayed signal "DI_DB" and "DI_3DB", respectively.

In such a second embodiment of the rising and falling converter, the second period 3T is longer than the first period 1T, resulting in the second working time t2' of the second partition signal DI_CP2 of the converted data input signal DI_C being longer than the first working time t1' of the first partition signal DI_CP1 of the converted data input signal DI_C, as shown in the waveform of the converted data input signal DI_C in FIG. 13.

And therefore, based on the above mentioned embodiments as disclosed in FIG. 10-11 and FIG. 12-13, it is apparent that the present invention achieves to sophisticatedly design the rising and falling converter so as to make the first working time t1' of the first partition signal DI_CP1 of the converted data input signal DI_C and the second working time t2' of the second partition signal DI_CP2 of the converted data input signal DI_C are different. It does not matter whether the first working time t1' of the first partition signal DI_CP1 is longer than the second working time t2' of the second partition signal DI_CP2, or the second working time t2' of the second partition signal DI_CP2 is longer than the first working time t1' of the first partition signal DI_CP1. As long as the first working time t1' of the first partition signal DI_CP1 and the second working time t2' of the second partition signal DI_CP2 are different, resulting in the first operational time t1 of the first division signal TXO_D1 of the transmitter output signal TXO and the second operational time t2 of the second division signal TXO_D2 of the transmitter output signal TXO are different, the present invention achieves to design a number of the first plurality of pulse carrier of the first division signal TXO_D1 differs from that of the second plurality of pulse carrier of the second division signal TXO_D2. Since the transmitter output signal of the transmitter circuit (TXO_D1, TXO_D2) are designed to comprise different number of pulse carriers in response to the rising edge and the falling edge of the data input signal DI, respectively, the proposed pulse carrier modulation technique is effective so as to avoid additional data communication channel for signal coupling. In addition, compared with the prior arts w % ben the transmitter circuit continued to output continuous and indefinite pulse carriers as the data input signal is high (or even low), the present invention is effective and beneficial to reduce power consumption and electromagnetic interferences due to a reduced number of pulse carriers of the transmitter output signal.

Furthermore, in the following paragraphs, the Applicants further provide experimental data and simulation results in accordance with the embodiments of the present invention, so as to verify the superior effect of the present invention.

Figure 14:
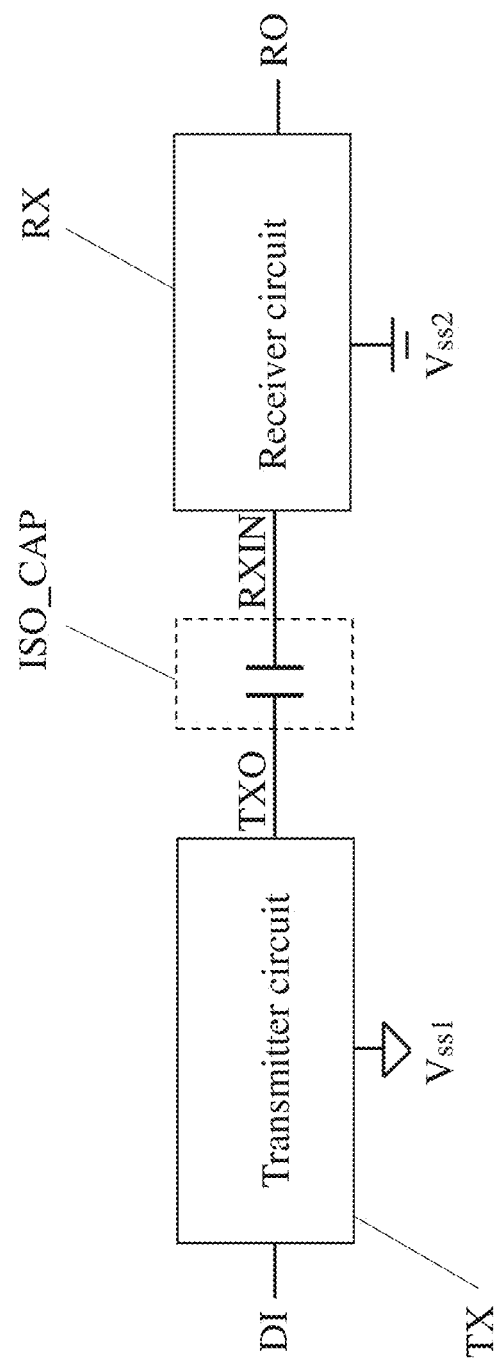
FIG. 14 shows a basic functional block diagram of a digital isolator module.
Figure 15:
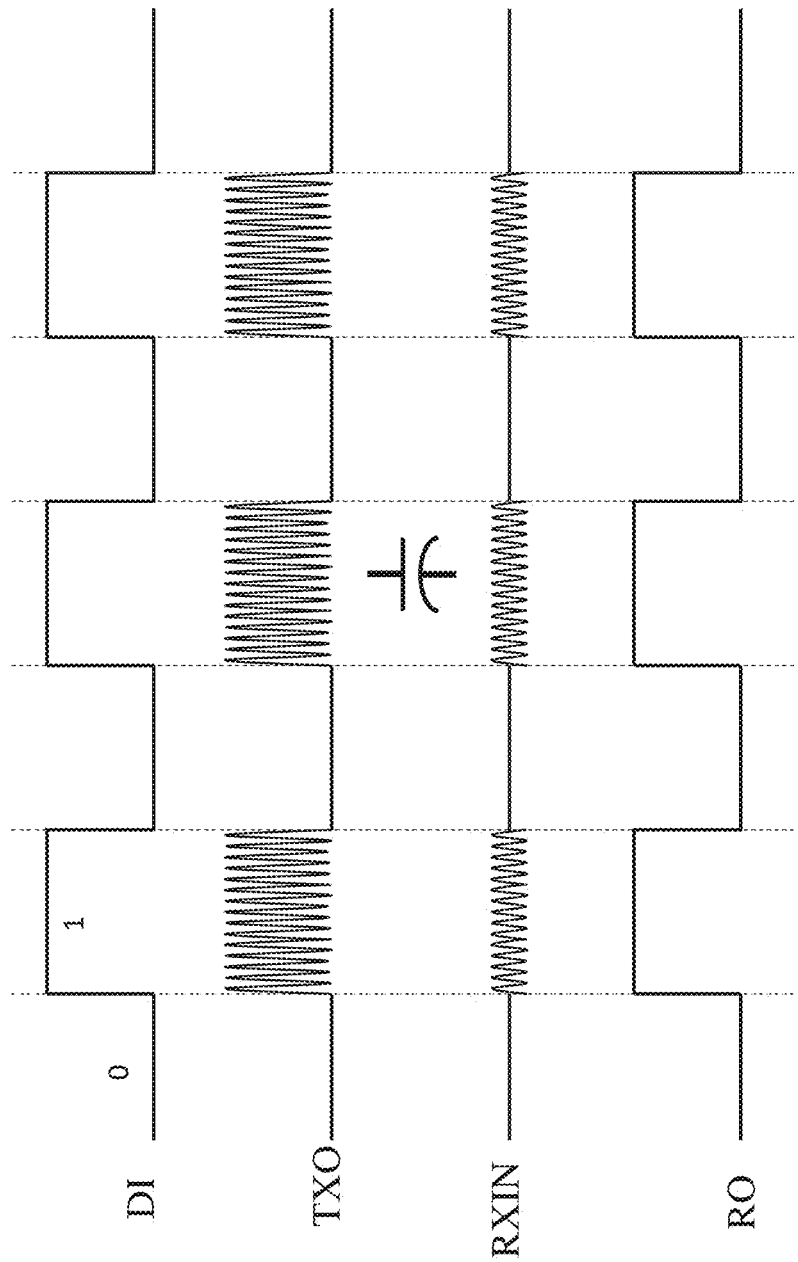
FIG. 15 shows a plurality of illustrated waveforms of the nodes as indicated in FIG. 14 when employing a traditional On/Off Keying (OOK) modulation to the transmitter circuit.
Figure 16:
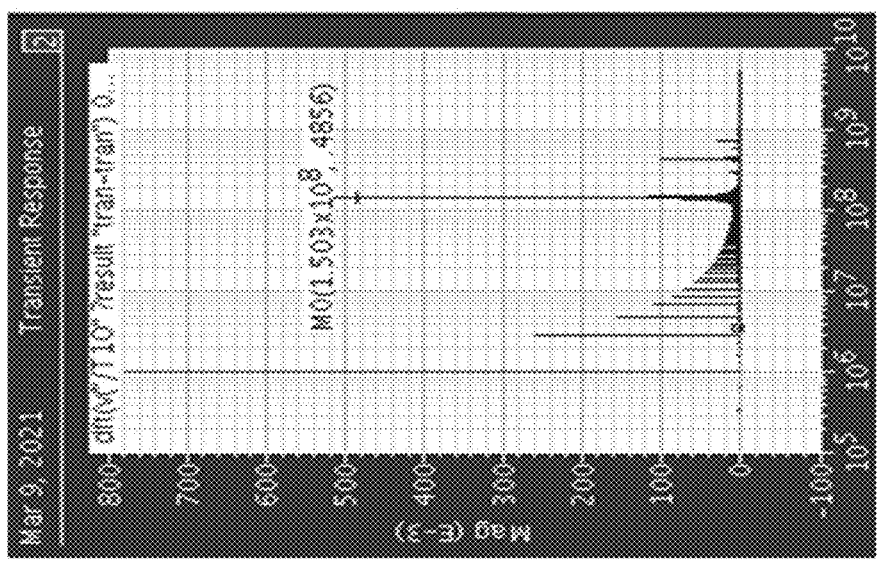
FIG. 16 shows a spectrum of the transmitter output signal TXO in accordance with FIG. 15 waveform.

Please refer to FIG. 14, which shows a basic functional block diagram of a digital isolator module, which comprises a transmitter circuit TX, a receiver circuit RX and an isolation capacitance ISO_CAP connected between the transmitter circuit TX and the receiver circuit RX. FIG. 15 shows a plurality of illustrated waveforms of the nodes as indicated in FIG. 14, when employing a traditional On/Off Keying (OOK) modulation to the transmitter circuit TX. As can be seen, when the data input signal DI=1, the transmitter output signal TXO continuously outputs the pulse carriers. And when the data input signal DI=0, the transmitter output signal TXO is kept at a fixed voltage level. The disadvantages of such a conventional OOK modulation technique is that, when the data input signal DI is maintained at the high voltage level (digital level="1") for too long, it affects the system and induces the IC to generate a much higher power consumption and severe electromagnetic interferences. FIG. 16 shows a spectrum of the transmitter output signal TXO in accordance with FIG. 15 waveform. It can be found that the main tone is approximately located at 150 MHz, and the energy is around 0.4856.

Figure 17:
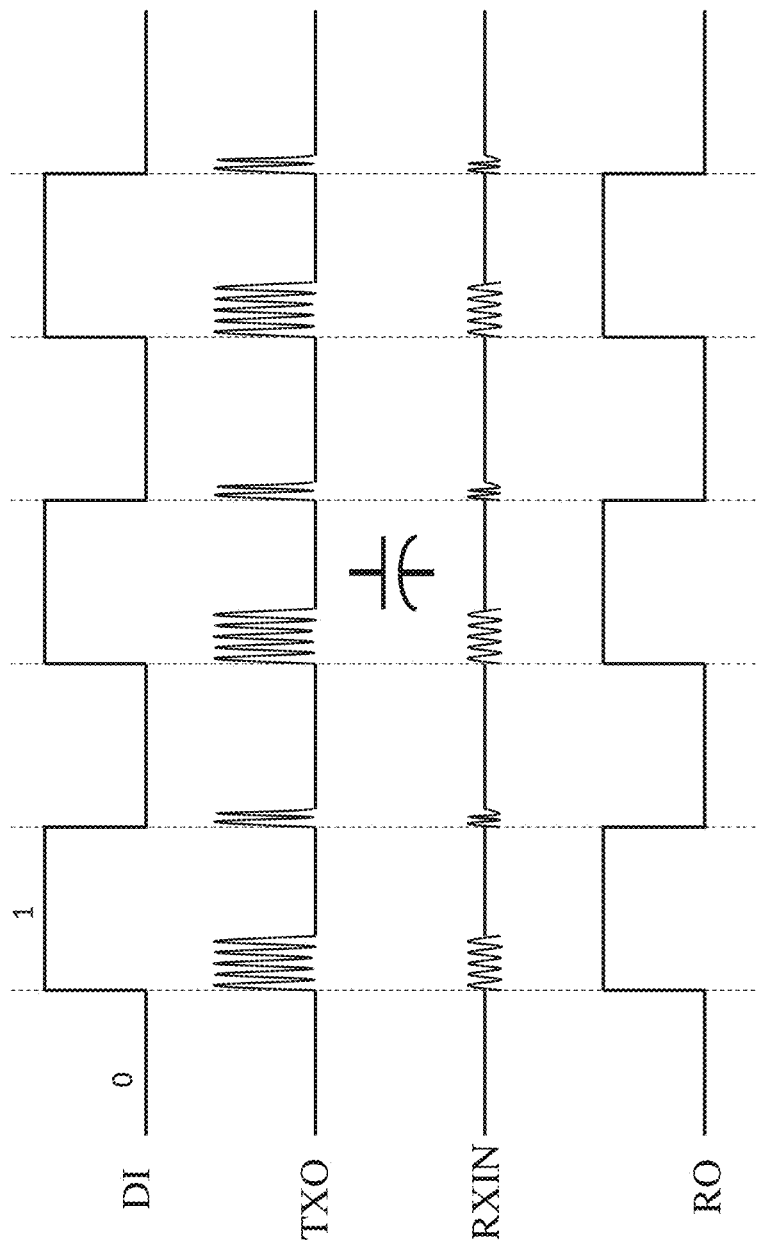
FIG. 17 shows a plurality of illustrated waveforms of the nodes as indicated in FIG. 14 when employing the proposed pulse carrier modulation (PCM) of the present invention to the transmitter circuit.
Figure 18:
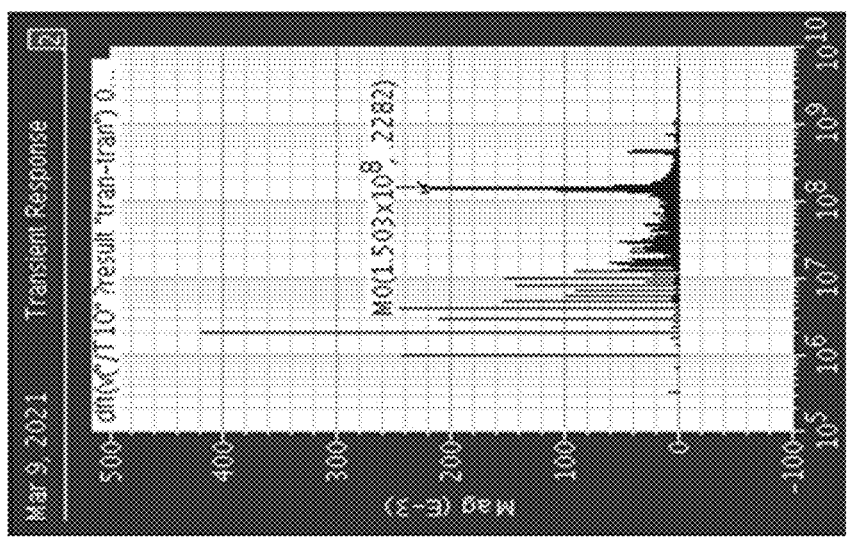
FIG. 18 shows a spectrum of the transmitter output signal TXO in accordance with FIG. 17 waveform.

On the contrary, FIG. 17 shows the plurality of illustrated waveforms of the nodes as indicated in FIG. 14, when employing the proposed pulse carrier modulation of the present invention to the transmitter circuit TX. FIG. 18 shows a spectrum of the transmitter output signal TXO in accordance with FIG. 17 waveform. From FIG. 18, it is obvious that the main tone is approximately located at 150 MHz, and the energy is reduced to 0.2282. As a result, by comparing these two spectrums in FIG. 16 and FIG. 18, it is believed that by employing the proposed pulse carrier modulation of the present invention, it helps to decrease the energy of the main tone by more than 50%, and thereby the electromagnetic interferences can be greatly reduced.

Figure 19:
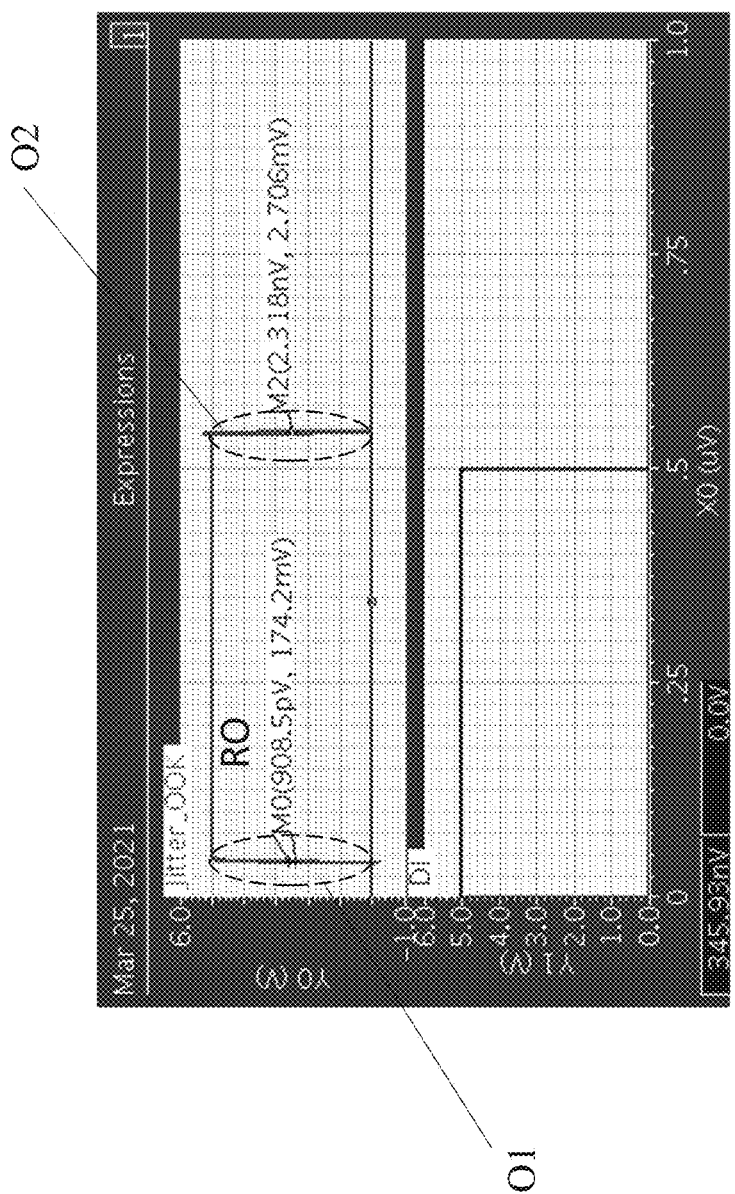
FIG. 19 shows simulation results of waveforms of the data input signal DI and the data output signal RO when applying a traditional On/Off Keying (OOK) modulation to the digital isolator module of FIG. 14.
Figure 20A:
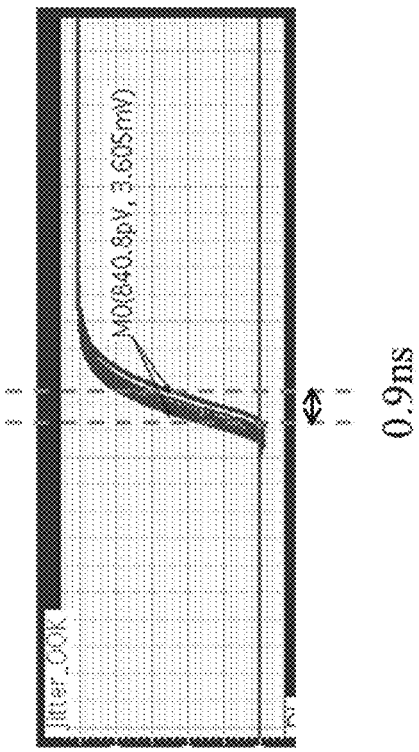
FIG. 20A and FIG. 20B respectively shows an enlarge view of the area O1 and O2 in FIG. 19.
Figure 20B:
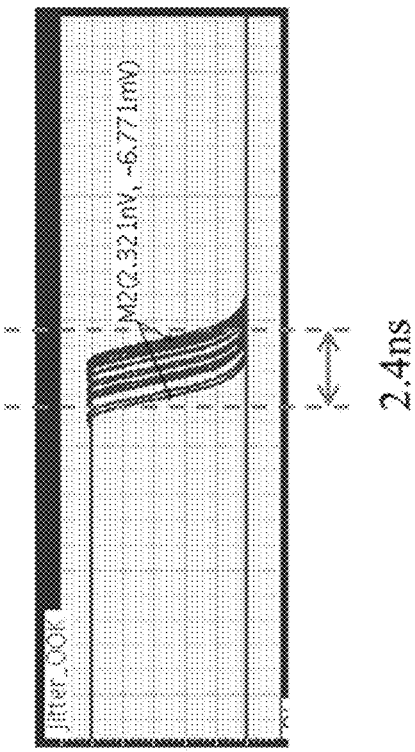

Moreover, the Applicants further provide a plurality of simulation results of waveforms of the data input signal DI and the data output signal RO when applying a traditional On/Off Keying (OOK) modulation to the digital isolator module of FIG. 14. The simulation results are shown in FIG. 19, and FIGS. 20A and 20B respectively shows an enlarge view of the area O1 and O2 in FIG. 19. As FIG. 20A and FIG. 20B illustrate, it can be found that the jitter of using a traditional OOK modulation technique is around 2.4 ns. It is believed that such jitter disturbance mainly comes because of the parasitic RC effect generated on the other side of the isolation capacitance ISO_CAP. Therefore, when the data input signal DI transitions from a digital level "1" to "0", the receiver input signal RXIN will not be pulled to a certain fixed voltage level immediately, thereby causing the jitter disturbance.

Figure 21:
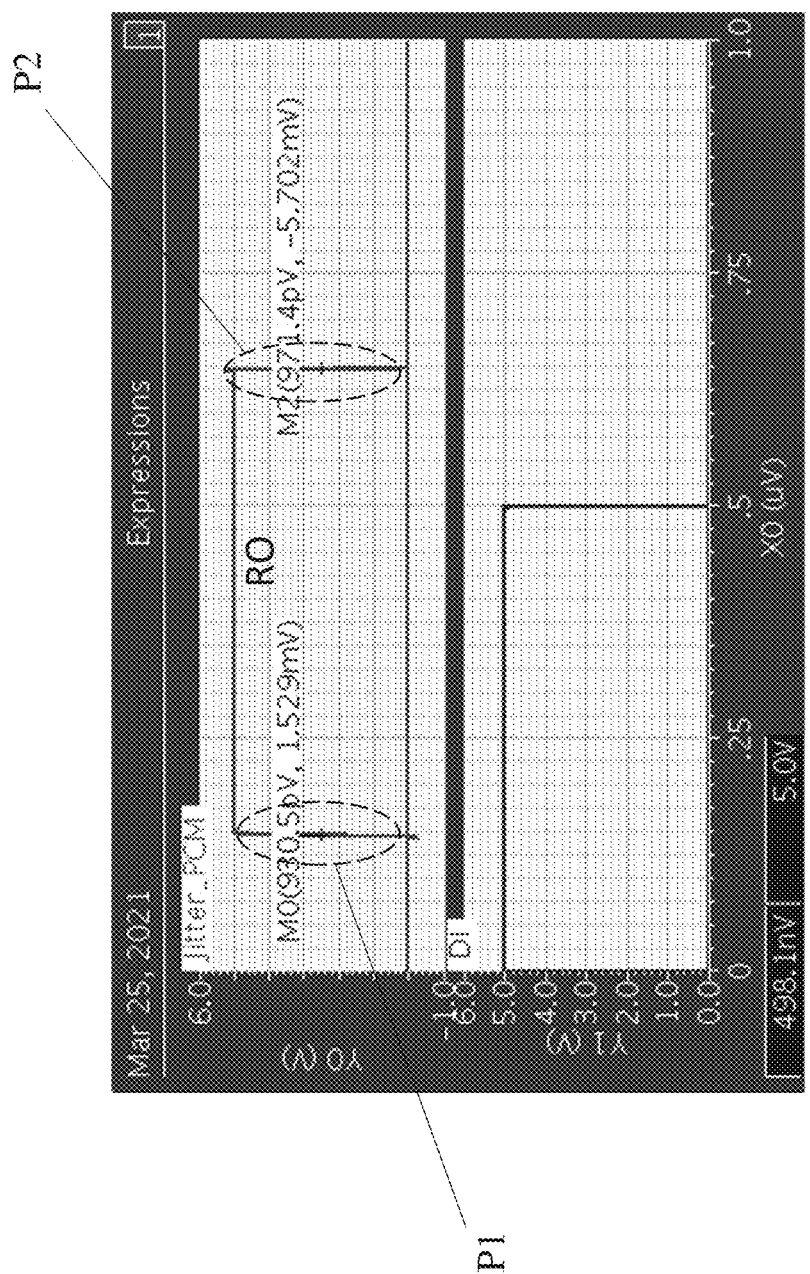
FIG. 21 shows simulation results of waveforms of the data input signal DI and the data output signal RO when applying the proposed pulse carrier modulation (PCM) of the present invention to the digital isolator module of FIG. 14.
Figure 22A:
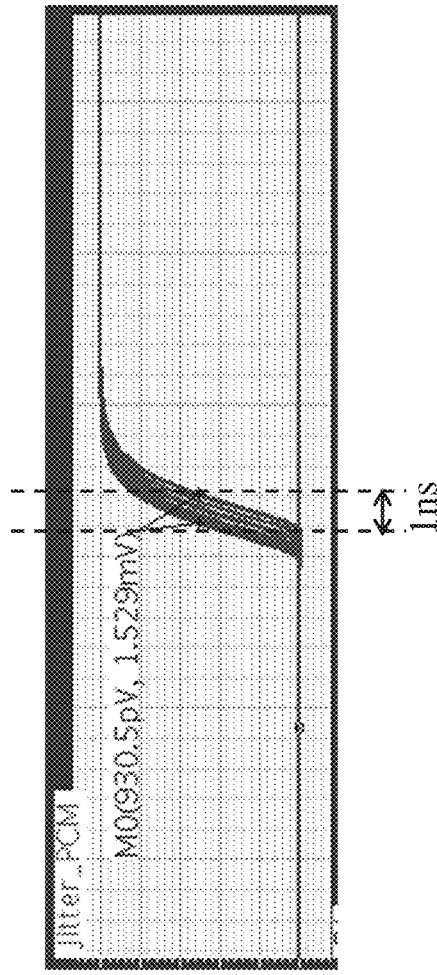
FIG. 22A and FIG. 22B respectively shows an enlarge view of the area P1 and P2 in FIG. 21.
Figure 22B:
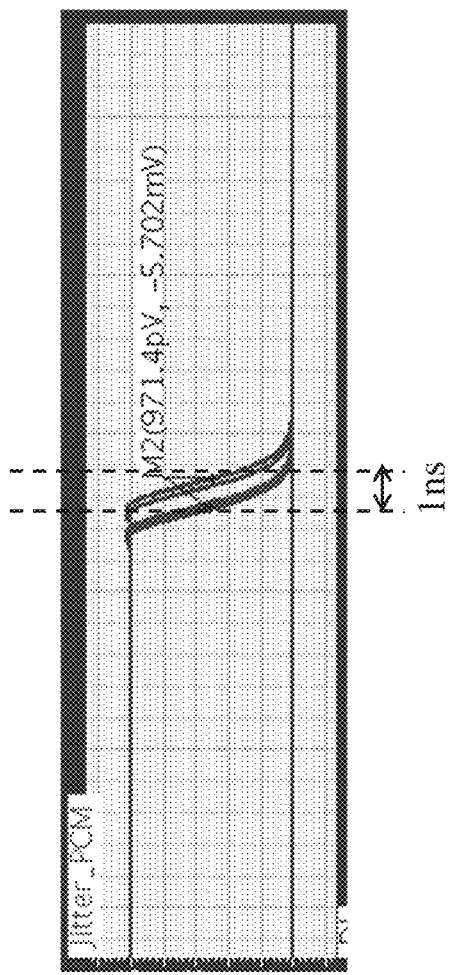

However, on the contrary, please refer to FIG. 21 for similar simulation results of waveforms of the data input signal DI and the data output signal RO when applying the proposed pulse carrier modulation (PCM) of the present invention to the digital isolator module of FIG. 14. The simulation results are shown in FIG. 21, and FIGS. 22A and 22B respectively shows an enlarge view of the area P1 and P2 in FIG. 21. As FIG. 22A and FIG. 22B illustrate, it is relatively obvious that the jitter of using the propose pulse carrier modulation (PCM) technique of the present invention is reduced to approximately 1 ns. It is believed that, since the pulse carrier of the transmitter output signal TXO by using the PCM technique, will end in a single one bit transition time of the data input signal DI, and the transmitter output signal TXO returns in a steady-state before the data input signal DI transitions to a next bit state, such novel feature helps to greatly reduce the occurrence of jitters.

And therefore, it is believed that the present invention achieves to maintain data output signals accurately and avoid jitter disturbances effectively. Meanwhile, the present invention is aimed to additionally solve the enormous power consumption and severe electromagnetic interference issues in the prior arts. A plurality of experimental data and simulation results are provided and have been verified as discussed in the earlier descriptions.

Therefore, based on at least one embodiment provided above, it is believed that the proposed digital isolator module of the present invention is characterized by utilizing a novel pulse carrier modulation technique. By employing the proposed pulse carrier modulation to a transmitter circuit, the transmitter circuit is operable to generate different number of pulse carriers respectively responsive to a rising edge and a falling edge of the data input signal. Since the transmitter circuit is adapted to output a first plurality of pulse carrier when the data input signal transitions from a digital level "0" to "1" and output a second plurality of pulse carrier when the data input signal transitions from a digital level "1" to "0" and a number of the first plurality of pulse carrier and that of the second plurality of pulse carrier are different, at least two communication-channels module of the prior arts is avoided. And the present invention is believed as beneficial to reducing channel numbers, IC power consumption and electromagnetic interferences. Meanwhile, by utilizing the proposed digital isolator module with pulse carrier modulation, the present invention assures data transmission accuracy and robustness of the system output voltages without the jitter disturbances.

As a result, when compared to the prior arts, it is obvious that the present invention apparently shows much more effective performances than before. In addition, it is believed that the present invention is instinct, effective and highly competitive for IC technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A digital isolator module with pulse carrier modulation, comprising:
    an isolation barrier, operable to develop an isolated output signal in response to an input signal;
    a transmitter circuit adapted to receive a data input signal and coupled to the isolation barrier, the transmitter circuit operable to generate a transmitter output signal for the input signal in response to the data input signal, wherein the transmitter output signal comprises a first division signal and a second division signal, the transmitter circuit starts to generate the first division signal responsive to a first transition of the data input signal from a first logic state to a second logic state and terminate generating the first division signal when the data input signal is still in the second logic state; and wherein the transmitter circuit starts to generate the second division signal responsive to a second transition of the data input signal from the second logic state to the first logic state and terminate generating the second division signal when the data input signal is still in the first logic state; and wherein the first division signal comprises a first plurality of pulse carrier, the second division signal comprises a second plurality of pulse carrier, and a number of the first plurality of pulse carrier of the first division signal and that of the second plurality of pulse carrier of the second division signal are different; and
    a receiver circuit coupled to the isolation barrier to receive the isolated output signal and operable to generate a data output signal in response to the isolated output signal.

2. The digital isolator module with pulse carrier modulation according to claim 1, wherein the transmitter output signal is periodic since a voltage level of the data input signal is followed by a voltage level of the transmitter output signal and the data input signal is periodic.

3. The digital isolator module with pulse carrier modulation according to claim 1, wherein a frequency of the first plurality of pulse carrier of the first division signal and that of the second plurality of pulse carrier of the second division signal are variable.

4. The digital isolator module with pulse carrier modulation according to claim 1, wherein an amplitude of the first plurality of pulse carrier of the first division signal and that of the second plurality of pulse carrier of the second division signal are variable.

5. The digital isolator module with pulse carrier modulation according to claim 1, wherein a voltage level of the transmitter output signal after the transmitter circuit terminates generating the first division signal or the second division signal is variable.

6. The digital isolator module with pulse carrier modulation according to claim 1, wherein a first operational time of the first division signal is a first time segment between the transmitter circuit starts to generate the first plurality of pulse carrier and to terminate generating the first plurality of pulse carrier, a second operational time of the second division signal is a second time segment between the transmitter circuit starts to generate the second plurality of pulse carrier and to terminate generating the second plurality of pulse carrier, and the first operational time of the first division signal and the second operational time of the second division signal are different.

7. The digital isolator module with pulse carrier modulation according to claim 6, wherein the transmitter circuit comprises:

a rising and falling converter, adapted to receive the data input signal and accordingly output a converted data input signal in response to a rising edge and a falling edge of the data input signal, wherein the converted data input signal comprises a first partition signal and a second partition signal, the rising and falling converter starts to generate the first partition signal responsive to the rising edge of the data input signal and terminate generating the first partition signal before the falling edge of the data input signal, and wherein the rising and falling converter starts to generate the second partition signal responsive to the falling edge of the data input signal and terminate generating the second partition signal before a next rising edge of the data input signal, and wherein a first working time of the first partition signal and a second working time of the second partition signal are different;

an oscillator, adapted to generate an oscillation signal; and an AND gate, being electrically connected with the rising and falling converter and the oscillator for receiving the converted data input signal and the oscillation signal, and outputting the transmitter output signal.

8. The digital isolator module with pulse carrier modulation according to claim 7, wherein the first transition of the data input signal from the first logic state to the second logic state is in response to the rising edge of the data input signal.

9. The digital isolator module with pulse carrier modulation according to claim 7, wherein the second transition of the data input signal from the second logic state to the first logic state is in response to the falling edge of the data input signal.

10. The digital isolator module with pulse carrier modulation according to claim 7, wherein the first operational time of the first division signal of the transmitter output signal is equal to the first working time of the first partition signal of the converted data input signal, and the second operational time of the second division signal of the transmitter output signal is equal to the second working time of the second partition signal of the converted data input signal.

11. The digital isolator module with pulse carrier modulation according to claim 7, wherein the rising and falling converter comprises an inverter, a first transmission gate, a second transmission gate, a third transmission gate, a fourth transmission gate and an NOR gate, wherein the inverter receives the data input signal and outputs an inverted data input signal, a first input end of the NOR gate is electrically connected with the first transmission gate and the second transmission gate, a second input end of the NOR gate is electrically connected with the third transmission gate and the fourth transmission gate, the first transmission gate and the third transmission gate are further connected with an input and an output of the inverter, respectively, and wherein the data input signal is delayed by a first period and a second period to respectively control the first transmission gate and the fourth transmission gate, the inverted data input signal is delayed by the first period and the second period to respectively control the second transmission gate and the third transmission gate, such that the NOR gate outputs the converted data input signal.

12. The digital isolator module with pulse carrier modulation according to claim 11, wherein when the first period is longer than the second period, the first working time of the first partition signal of the converted data input signal is longer than the second working time of the second partition signal of the converted data input signal.

13. The digital isolator module with pulse carrier modulation according to claim 11, wherein when the second period is longer than the first period, the second working time of the second partition signal of the converted data input signal is longer than the first working time of the first partition signal of the converted data input signal.

* * * * *